(12) United States Patent
Saigoh et al.

(10) Patent No.: US 7,288,799 B2
(45) Date of Patent: Oct. 30, 2007

(54) SEMICONDUCTOR DEVICE AND FABRICATION METHOD THEREOF

(75) Inventors: Kaoru Saigoh, Kawasaki (JP); Kouichi Nagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/835,310

(22) Filed: Apr. 30, 2004

(65) Prior Publication Data

US 2005/0127395 A1    Jun. 16, 2005

(30) Foreign Application Priority Data

Dec. 11, 2003    (JP) ............................. 2003-413199

(51) Int. Cl.
*H01L 29/74* (2006.01)
*H01L 29/76* (2006.01)

(52) U.S. Cl. ...................... 257/127; 257/295; 257/296; 257/E29.012; 257/E29.013

(58) Field of Classification Search ............ 438/3, 438/240, 253, 396, 627, 643; 257/127, 295, 257/E29.012, E29.013, E27.104, E21.664
See application file for complete search history.

(56) References Cited

U.S. PATENT DOCUMENTS 6,627,462 B1 * 9/2003 Yang et al. ................. 438/3
6,635,528 B2 * 10/2003 Gilbert et al. .............. 438/253
2002/0061620 A1 * 5/2002 Hikosaka et al. .......... 438/240
2004/0202827 A1 10/2004 Okuda
2005/0186364 A1 8/2005 Okuda

FOREIGN PATENT DOCUMENTS

| JP | 2000-277465 | 10/2000 |
|---|---|---|
| KR | 2001-4372 | 1/2001 |
| KR | 2001-0029846 A | 4/2001 |
| KR | 2001-0061370 A | 7/2001 |

OTHER PUBLICATIONS

Notice Requesting Submission of Opinion dated Mar. 28, 2006 issued in corresponding Korean Patent Application No. 10-2004-0037207.
Korean Office Action dated Oct. 31, 2006, issued in corresponding Korean patent application No. 10-2004-0037207.

* cited by examiner

*Primary Examiner*—Long K. Tran
(74) *Attorney, Agent, or Firm*—Westerman, Hattori, Daniels & Adrian, LLP.

(57) ABSTRACT

A semiconductor device includes a semiconductor substrate, a circuit part formed on and above the semiconductor substrate, a passivation film covering the circuit part, an electrode pad provided outside the circuit part in such a manner that the electrode pad is exposed from the passivation film, and a guard ring pattern provided between the electrode pad and the circuit part such that the guard ring pattern surrounds the circuit part substantially. The guard ring pattern extends from a surface of the semiconductor substrate to the passivation film.

13 Claims, 19 Drawing Sheets

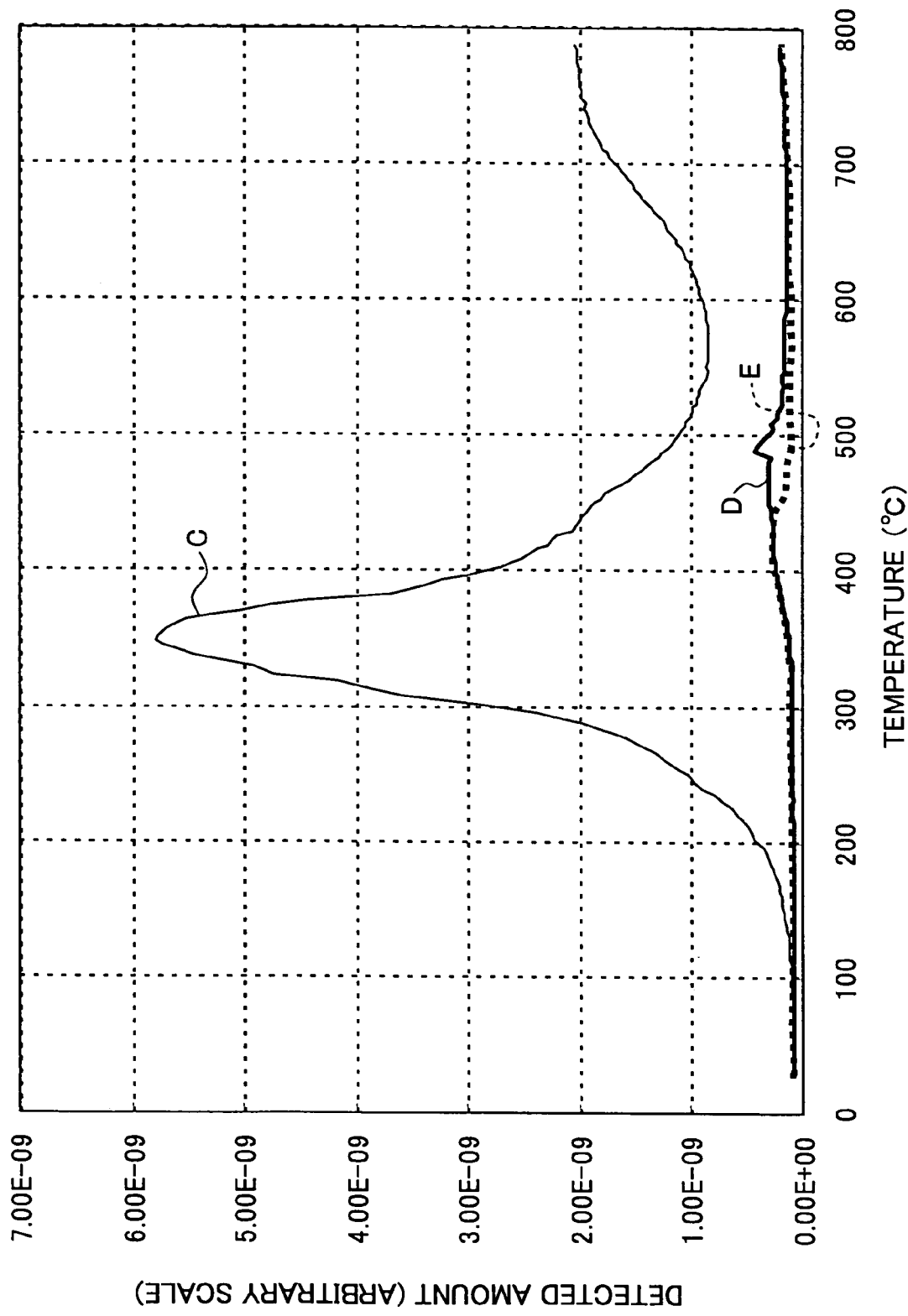

SEMICONDUCTOR DEVICE AND FABRICATION METHOD THEREOF

CROSS-REFERENCE TO RELATED APPLICATION

The present application is based on Japanese priority application No.2003-413199 filed on Dec. 11, 2003, the entire contents of which are hereby incorporated by reference.

BACKGROUND OF THE INVENTION

The present invention relates to semiconductor devices and fabrication process thereof and more particularly to a semiconductor device having a ferroelectric capacitor and a fabrication process thereof.

Intensive efforts are being made for developing a ferroelectric random access memory (FeRAM), wherein a ferroelectric random access memory is a semiconductor memory device that holds information in a ferroelectric capacitor by utilizing polarization of a ferroelectric film. A ferroelectric memory is non-volatile in that it holds the information even when electric power supplied thereto is turned off and thus attracts much attention in view of the possibility of realizing a memory device of high density integration, high speed driving, high durability and low electric power consumption.

For the material of the ferroelectric film that constitutes the ferroelectric capacitor, a ferroelectric oxide having a perovskite crystal structure characterized by a large residual dielectric polarization of 10–30 $\mu C/cm^2$, such as PZT (Pb(Zr,Ti)$O_3$), SBT (SrBi$_2$Ta$_2$O$_9$), and the like, is used.

With such a ferroelectric film, it has been known that the characteristics of the ferroelectric material are deteriorated when moisture has penetrated from outside via an interlayer insulation film such as silicon oxide film, which has high affinity to water.

More specifically, water thus penetrated into the semiconductor device undergoes decomposition into hydrogen and oxygen during the high temperature semiconductor process used at the time of formation of the interlayer insulation film or metal wiring patterns, while the hydrogen atoms thus formed cause formation of oxygen defects in the ferroelectric film as a result of causing reaction with oxygen in the ferroelectric film. Thereby, crystallinity of the ferroelectric film is degraded. A similar phenomenon is caused also by prolonged use of the ferroelectric memory. As a result, there occurs degradation of performance in the ferroelectric capacitor such as decrease of the residual dielectric polarization or decrease of the dielectric constant. Further, there occur also the cases in which the performance of the transistors and other devices is degraded.

In order to deal with such degradation of the ferro electric capacitor, there has been proposed an IC chip that uses a water-blocking guard ring that prevents penetration of water to the IC chip. Reference should be made to Japanese Laid-Open Patent Publication 2000-277465.

FIG. 1A shows such a conventional IC chip 100 in a plan view while FIG. 1B shows the IC chip of FIG. 1A in a cross-sectional view taken along an A–A' line of FIG. 1A.

Referring to FIGS. 1A and 1B, the IC chip 100 is constructed on a semiconductor substrate 101 and includes a circuit part 104 in which there is formed a transistor 102 and a ferroelectric capacitor 103. The circuit part 104 is covered with an interlayer insulation film 105 of silicon oxide, and the like, formed on the semiconductor substrate 101, while there is provided an water-blocking guard ring 108 on the peripheral part 106 of the IC chip 100 surrounding the circuit part 104 such that the water-blocking guard ring 108 extends from the surface of the semiconductor substrate 101 to a passivation film 111. Further, there is a proposal not illustrated to provide a guard ring of a metal film on a sidewall surface 105 of the interlayer insulation film exposed as a result of the dicing process at the time of dicing the individual IC chips from a semiconductor wafer. Such a water-blocking guard ring 108 blocks the moisture penetrating from the sidewall surface 109 and hence the degradation of the ferroelectric capacitor caused by the wager penetrating into the circuit part 104.

SUMMARY OF THE INVENTION

In the plan view of FIG. 1A, it should be noted that there is formed an electrode pad 110 at the inner side of the water-blocking ring 108 in this prior art for sending and receiving signals between an external circuit and the elements formed in the circuit part 104.

The electrode pad 110 is used for wire bonding connection, and thus, there is formed an opening 111-1 in the passivation film 111 in correspondence to each of the electrode pads 110.

It should be noted that the passivation film 111 itself is formed of a silicon nitride film or a polyimide film that blocks moisture effectively, while there can exist a minute gap between the electrode pad 110 and the passivation film 108. Further, there can be a case in which the silicon oxide film used for the under layer of the passivation film 108 is exposed at a sidewall surface 111a of the opening 111-1. In any of these cases, moisture in the environment can enter the circuit part 104 through the gap of the electrode pad 110 or from the exposed surface of the underlying layer even though the foregoing water-blocking guard ring 108 is provided. Thereby, degradation of performance may be caused in the ferroelectric capacitor 103.

Further, according to the investigation made by the inventor of the present invention on a device shown in FIG. 2, in which the IC chip 100 of FIG. 1 is bonded upon a base 115 and covered with a resin layer 110 after wiring the electrode pads 110 to respective inner leads 118 via corresponding bonding wires 116, it was confirmed that there appear numerous defective memory cells in the vicinity of the electrode pad 110 when the device is subjected to a so-called PTHS (pressure thermal humidity stress) test in which a read test is conducted after holding the device in a stressed environment of high temperature, high humidity and high pressure. Thus, with the IC chip 100 having the conventional water-blocking ring 108 of FIG. 1, there arises the problem of poor resistance against moisture particularly in the part near the electrode pad 110.

Further, the silicon oxide film used for the interlayer insulation film 105 covering the ferroelectric capacitor 103 has a drawback, in view of the high affinity thereof to water, in that moisture easily penetrates into the film and that the moisture thus penetrated from outside easily reach the region in the vicinity of the semiconductor substrate surface, leading to degradation of performance of the transistor.

Accordingly, the present invention has been made in view of the foregoing problems and has the object of providing a semiconductor device having improved reliability over a long period of time by effectively eliminating the performance degradation caused by penetration of moisture and further a fabrication process of such a semiconductor device.

Another and more specific object of the present invention is to provide a semiconductor device having a ferroelectric capacitor in which degradation of the ferroelectric capacitor caused by penetration of water is effectively suppressed.

According to an aspect of the present invention, there is provided a semiconductor device comprising:

a semiconductor substrate; a circuit part formed over said semiconductor substrate; a passivation film covering said circuit part; an electrode pad provided outside said circuit part in such a manner that said electrode pad is exposed from said passivation film; and a guard ring pattern provided between said electrode pad and said circuit part such that said guard ring pattern surrounds said circuit part substantially, said guard ring pattern extending from a surface of said semiconductor substrate to said passivation film.

According to the present invention, it becomes possible to block the moisture penetrating from the electrode pad by forming the guard ring between the electrode pad and the circuit part so as to surround the circuit part substantially. Thereby, deterioration of performance is successfully avoided for the elements formed in the circuit part, particularly the ferroelectric capacitor formed in the circuit part.

In another aspect, there is provided a semiconductor device comprising: a semiconductor substrate; a ferroelectric capacitor formed over said semiconductor substrate, said ferroelectric capacitor including a ferroelectric capacitor insulation film; an interlayer insulation film covering said ferroelectric capacitor; and an interconnection layer formed on said interlayer insulation film, wherein there is provided, between said interlayer insulation film and said interconnection layer, a barrier layer blocking penetration of moisture therethrough and an insulating metal oxide film covering said barrier layer and said interconnection layer.

According to the present invention, the moisture invading into the semiconductor device from outside through the surface thereof is completely blocked by providing the barrier layer on the interlayer insulation film covering the ferroelectric capacitor and further providing the insulating metal oxide film on the barrier layer. Thereby, the problem of the invaded moisture reaching the ferroelectric capacitor is effectively prevented.

According to another aspect of the present invention, there is provided a semiconductor device comprising: a semiconductor substrate; a circuit part formed over said semiconductor substrate, said circuit part including a ferroelectric capacitor; an interlayer insulation film covering said circuit part; an electrode pad formed over said interlayer insulation film; and a passivation film covering the entirety of said interlayer insulation film except for an opening formed in said passivation film so as to expose a surface of said electrode pad, said passivation film comprising a barrier layer blocking penetration of moisture, said barrier layer covering the entirety of an inner wall surface of said aperture.

According to the present invention, penetration of moisture through the inner wall surface of the opening is presented by covering the entirety of the sidewall surface of the opening formed in the passivation film so as to expose the electrode pad. Thereby, occurrence of defect by deterioration of the ferroelectric capacitor is prevented effectively even in the case the semiconductor device is subjected to a PTHS test and held under a stressed environment of high temperature, high humidity and high pressure.

Thus, according to the present invention, penetration of water from the surface and sidewall surface of the semiconductor device, particularly from the electrode pad or the region surrounding the electrode pad is blocked effectively, and deterioration of device performance, particularly the deterioration of the ferroelectric capacitor is prevented. Thereby, a semiconductor device having excellent long-term reliability is realized.

BRIEF DESCRIPTION OF THE DRAWINGS

FIG. 9 is another diagram for explaining the moisture blocking performance of a silicon oxynitride film;

DETAILED DESCRIPTION OF THE PREFERRED EMBODIMENTS

First Embodiment

Figure 1A:
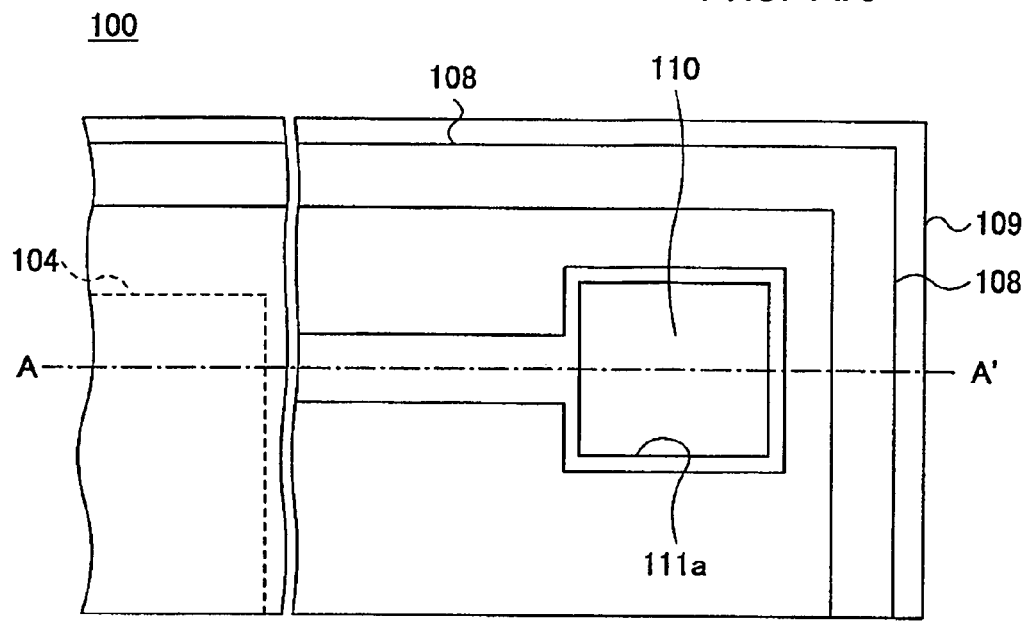
FIG. 1A is a plan view diagram showing a peripheral part of a conventional IC chip in an enlarged scale.
Figure 1B:
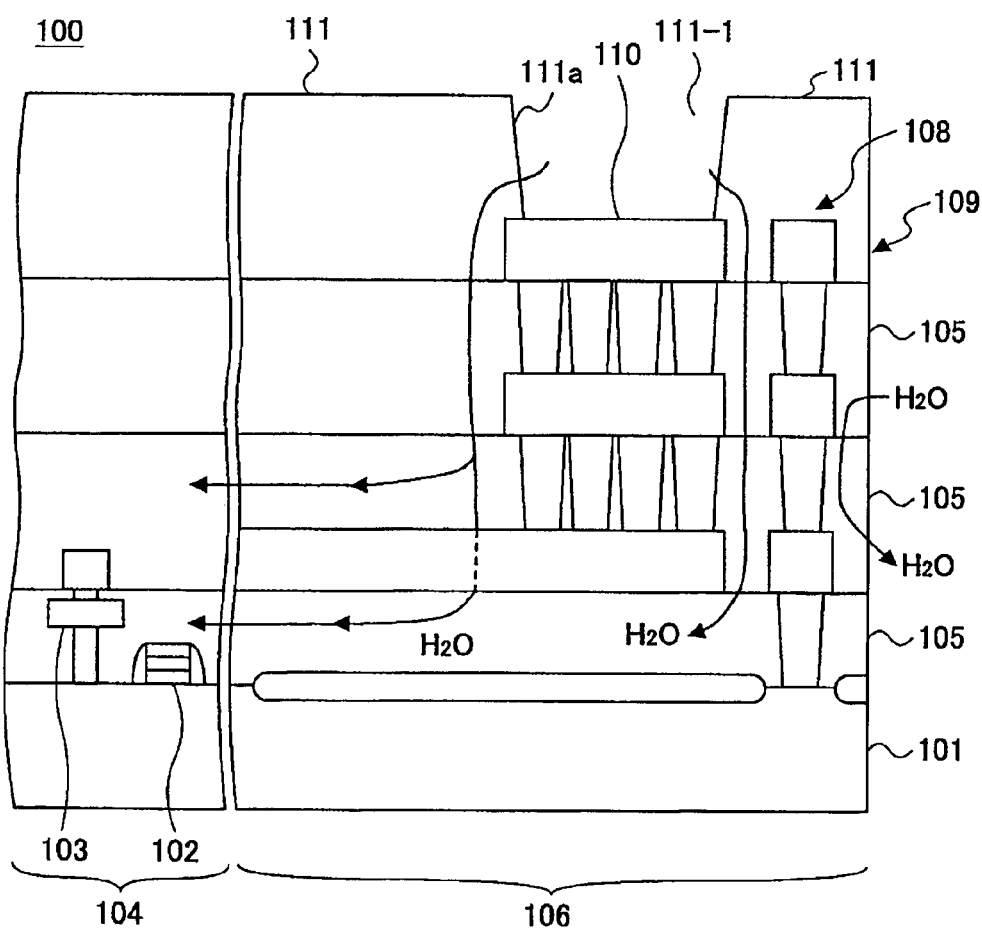
FIG. 1B is a cross-sectional view of FIG. 1A taken along an A–A' line shown in FIG. 1A.
Figure 2:
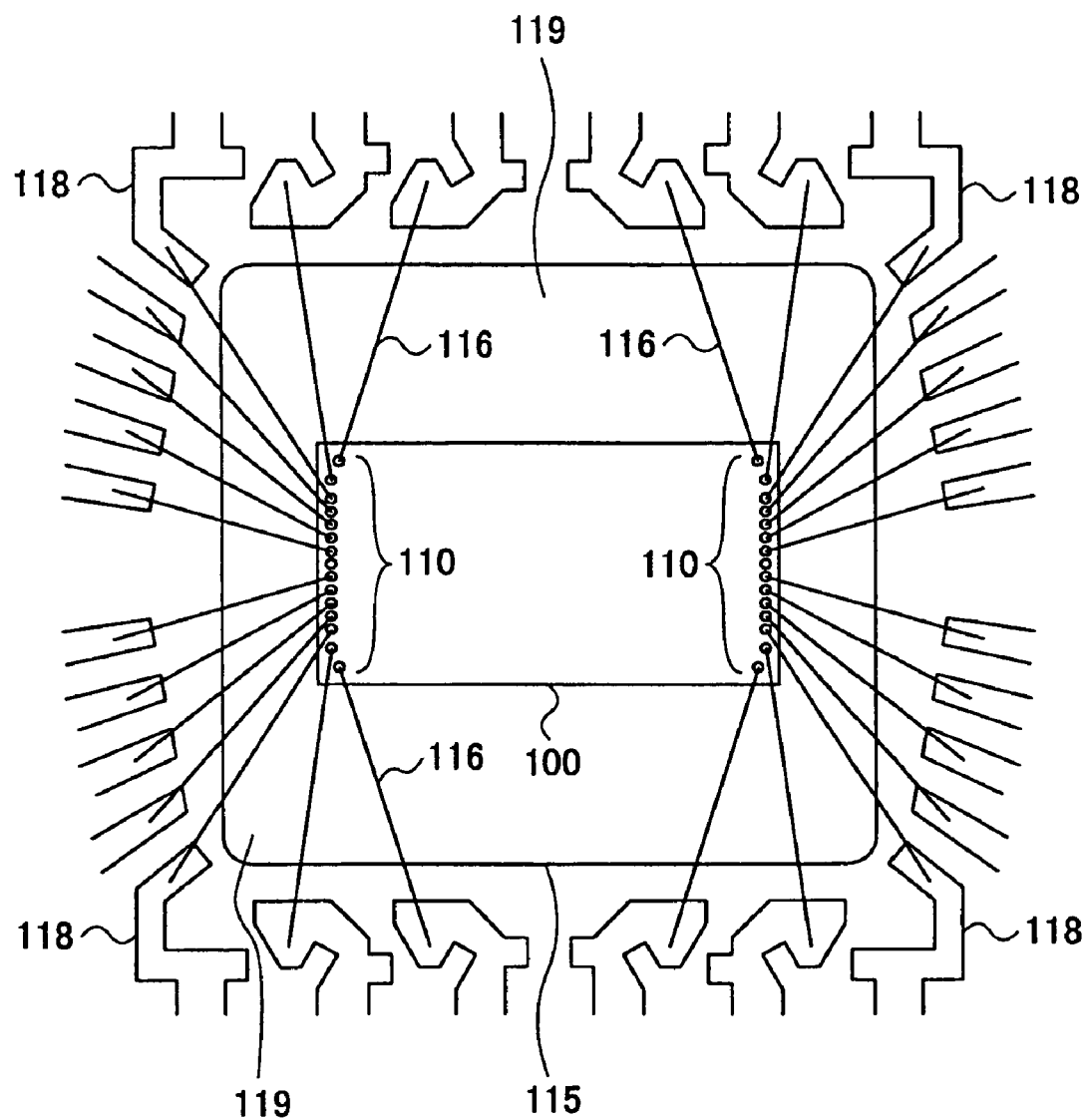
FIG. 2 is a diagram explaining the problem of a conventional semiconductor device.
Figure 3:
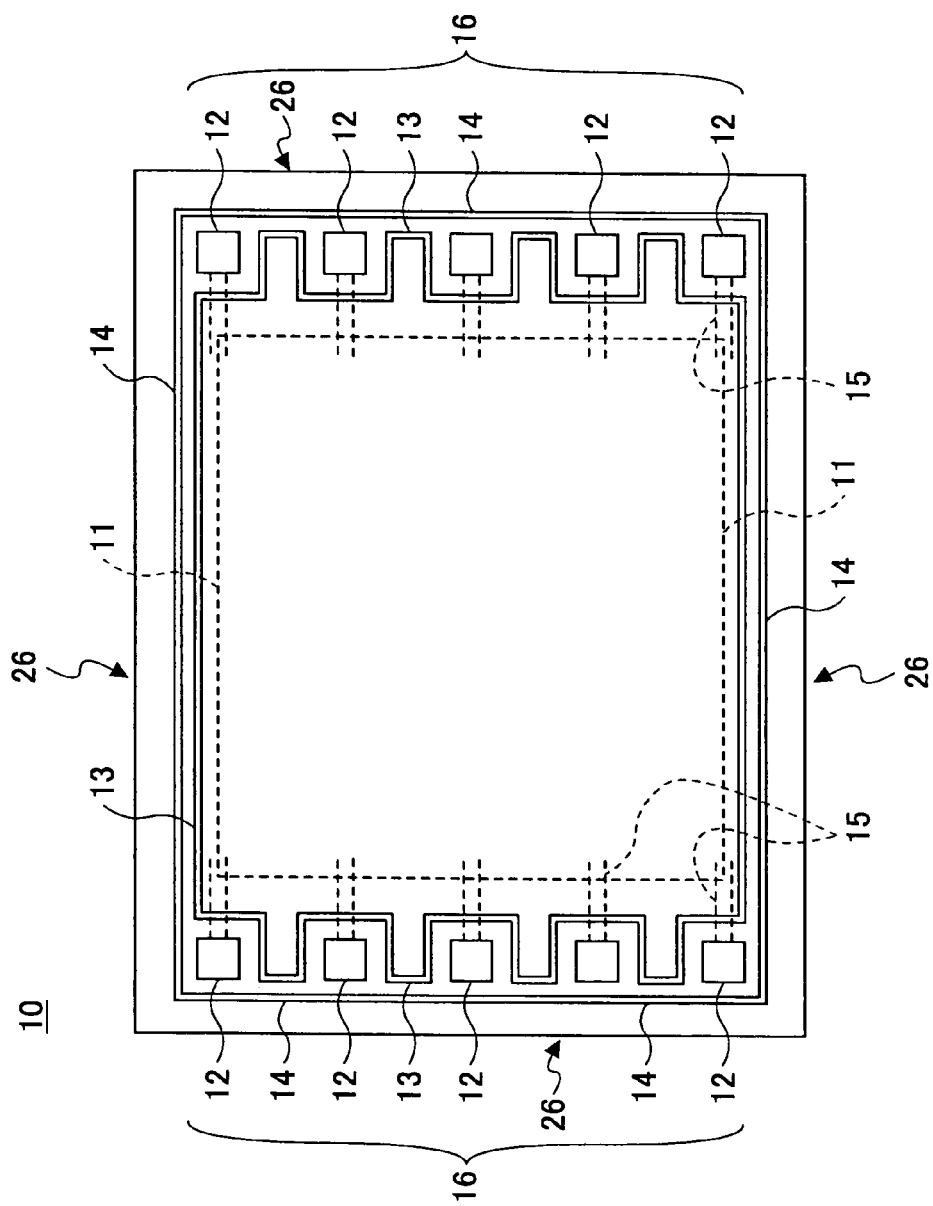
FIG. 3 is a plan view diagram showing the construction of a semiconductor device according to a first embodiment of the present invention.

FIG. 3 is a plan view diagram showing a semiconductor device 10 according to a first embodiment of the present invention.

Referring to FIG. 3, the semiconductor device 10 is a ferroelectric random access memory and includes a circuit part 11, plural electrode pads 12, a first water-blocking guard ring 13, a second water-blocking guard ring 14, wiring patterns 15, and the like.

The circuit part 11 is formed on a semiconductor substrate to be explained later and includes transistors, ferroelectric capacitors, interconnection layers, and the like. On the other hand, the electrode pads 12 are disposed at the peripheral part 16 of the semiconductor device 10 for wire bonding to inner leads of a package not illustrated. Thereby, the terminals of the package are connected to the circuit part 11 via the plugs, conductive pads and interconnection layers inside the semiconductor device 10.

Here, it should be noted that the first water-blocking guard ring 13 is formed between the circuit part 11 and the electrode pads 12 so as to surround the circuit part 11 continuously. On the other hand, the second water-blocking guard ring 14 is disposed outside the electrode pads 12 along a sidewall surface 26 of the semiconductor device 10 so as to surround the circuit part 11, the first water-blocking guard ring 13 and the electrode pads 12.

Hereinafter, the first and second water-blocking guard rings 13 and 14 will be explained in detail.

Figure 4:
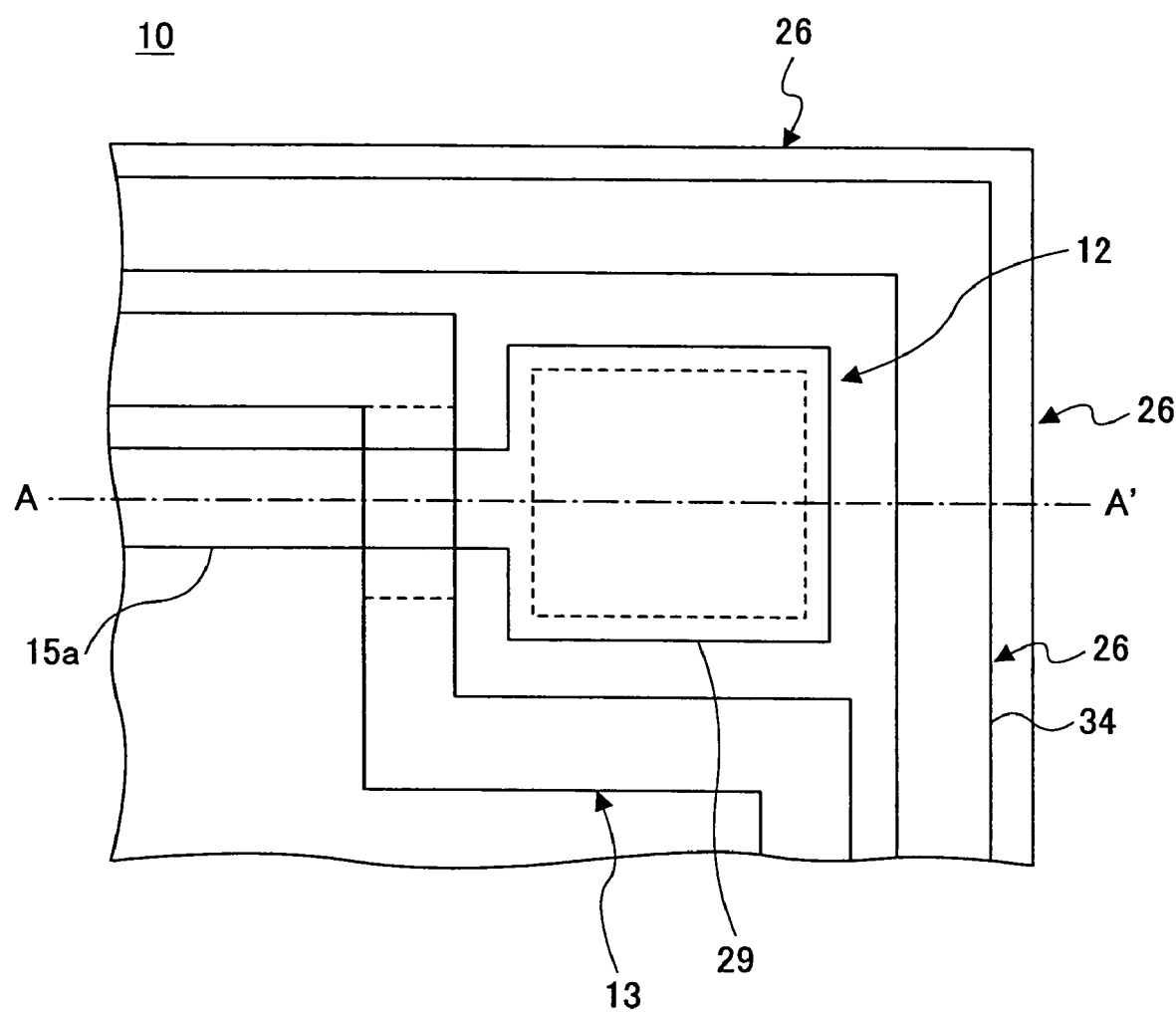
FIG. 4 is a plan view diagram showing a part of the semiconductor device of FIG. 3 in an enlarged scale.
Figure 5:
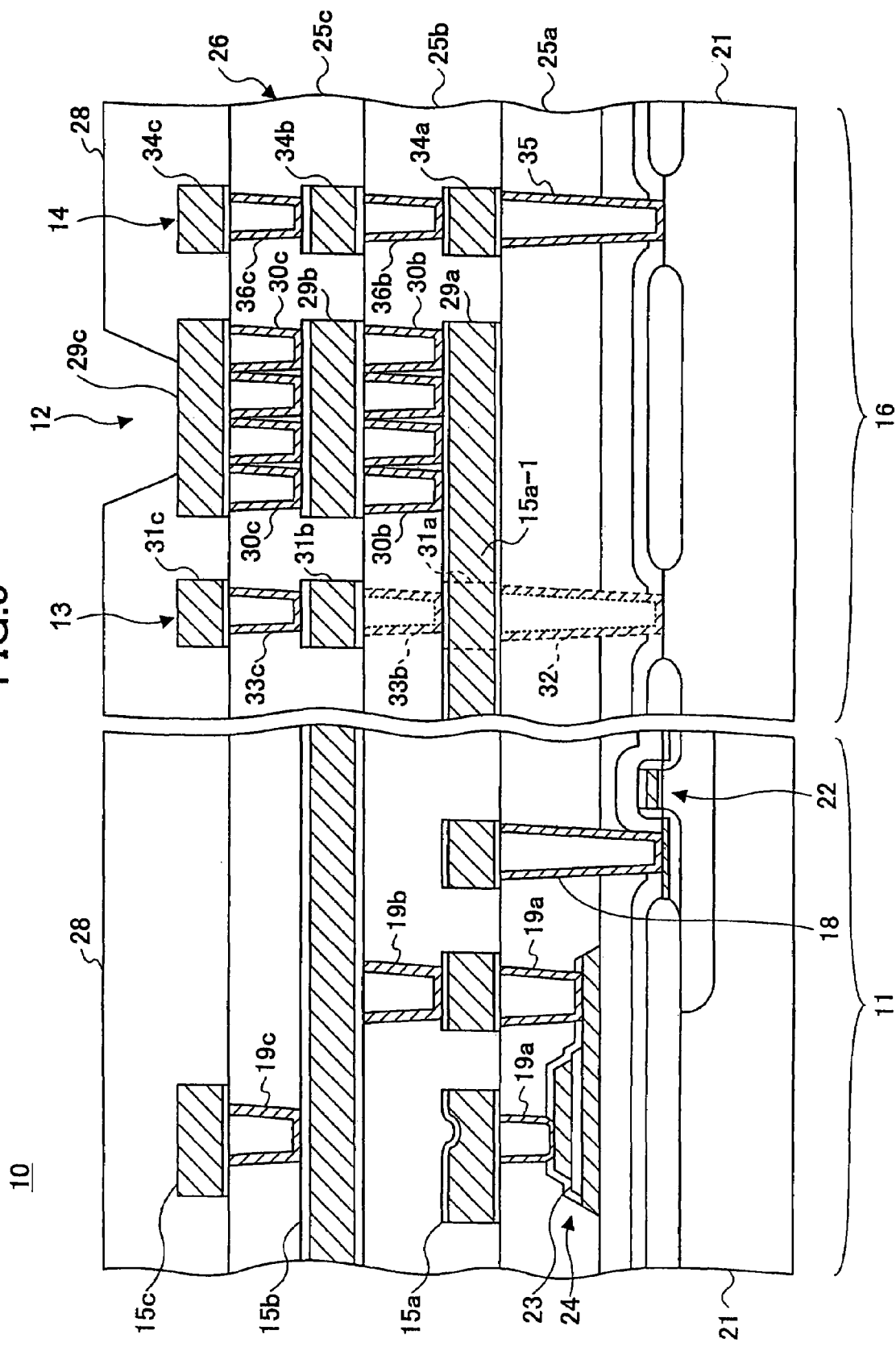
FIG. 5 is a cross-sectional diagram of the semiconductor device of FIG. 3 for the part along a line A–A' of FIG. 4 and also the part constituting a circuit part.

FIG. 4 is a plan view diagram showing a part of the semiconductor device of FIG. 3 in an enlarged scale, while FIG. 5 shows the cross-section of FIG. 4 taken along a line A–A' together with the cross-section of the circuit part 11 of FIG. 3. In FIG. 5, it should be noted that the illustrated cross section of the circuit part 11 merely shows an appropriate part of the circuit part 11 and is not limited to the region corresponding to the line A–A' of FIG. 4.

Referring to FIGS. 4 and 5, the semiconductor device 10 is generally formed of the circuit part 11 in which various circuit elements are formed and the peripheral part 16, wherein the peripheral part 16 includes therein the electrode pads 12 disposed around the circuit part 11, the first water-blocking guard ring 13 and the second water-blocking guard ring 14.

The circuit part 11 is formed of a semiconductor substrate 21, a transistor 22 formed on the semiconductor substrate 21, a ferroelectric capacitor 24 having a ferroelectric capacitor insulation film 23 that holds information therein in the form of polarization, interconnection patterns 15a–15c forming the interconnection layer 15, a contact plug 18 connecting the diffusion region of the transistor 22 to the interconnection pattern 15a, via plugs 19a–19c connecting the interconnection patterns 15a–15c of various layers, and interlayer insulation films 25a–25c collectively represented as an interlayer insulation film 25.

In an example, an FeRAM of 1T1C (one transistor, 1 capacitor) construction may be formed in the circuit part 11 of the semiconductor device 10. Because the ferroelectric capacitor 24 is identical with the ferroelectric capacitor to be explained in detail later, further explanation thereof will be omitted for the moment.

In the present embodiment, first through third interlayer insulation films 25a–25c are formed on the semiconductor substrate 21 as the interlayer insulation film 25, while the interconnection layer 15 is formed of the first through third interconnection layers 15a–15c as noted before. In the description hereinafter, it should be noted that designation of the interlayer insulation film or interconnection layer without the suffix a–c is used to represent any or all three layers.

In the description hereinafter, emphasis will be made on the peripheral part 16.

Referring to FIG. 5, the electrode pad 12 is formed of upper, middle and lower conductive pads 29 and plugs 30 connecting the conductive pad 29 with each other electrically through the first through third interlayer insulation films 25. Each of the upper, middle and lower conductive pads 29 have a similar size and provided on the respective interlayer insulation films 25. Typically, a conductive pad 29 is formed of an aluminum film sandwiched by upper and lower thin TiN films. The conductive pads 29 of respective layers are formed simultaneously with the corresponding interconnection layers 15 of the circuit part 11

Particularly, it should be noted that the conductive pad 29a formed on the surface of the first interlayer insulation film 25a is connected to the circuit part 11 via an interconnection pattern 15a-1. Further, it should be noted that the conductive pad formed on the surface of the third interlayer insulation film 25c is exposed via an opening formed in the passivation film 28. The conductive pad 29c is used for the wire bonding pad.

Further, it should be noted that the plugs 30b and 30c have a rectangular or elliptical cross-section and connect the foregoing upper, middle and lower conductive pads 29a, 29b and 29c with each other. Thereby, each of the plugs 30b and 30c is formed of lamination of conductive films such as a tungsten film, aluminum film, and the like, and a TiN film. The plugs 30 are formed simultaneously with the plugs 19 of the circuit part 11 layer by layer. Thereby, the plug 30 may be provided in plural numbers in a single interlayer insulation film 25. Alternatively, it is possible to provide only one plug 30 in one interlayer insulation film 25.

It should be noted that the electrode pad 12 having such a construction sends the external signals supplied thereto via a bonding wire to the circuit part 11 and further supplies the signals from the circuit part 11 to the external circuit. It should be noted that the present invention is not limited to the foregoing specific construction of the electrode pad 12 and the electrode pad of any known construction may be used.

As noted before, the first water-blocking ring 13 is provided between the circuit part 11 and the electrode pads 12 and is formed so as to surround the circuit part 11. The water-blocking guard ring 13 is formed of a guard ring pad 31, a guard ring contact 32 and a guard ring plug 33.

Figure 6A:
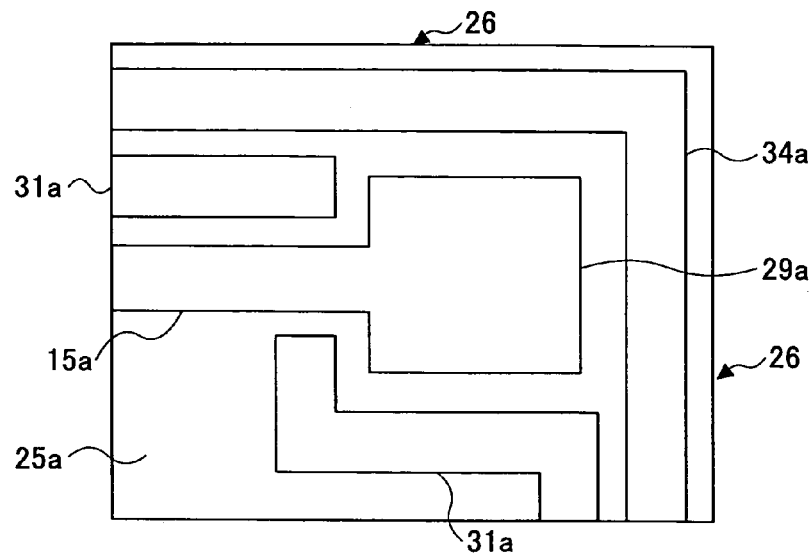
FIGS. 6A–6C are plan view diagrams showing respective layers in the peripheral part of the semiconductor device in an enlarged scale.
Figure 6B:
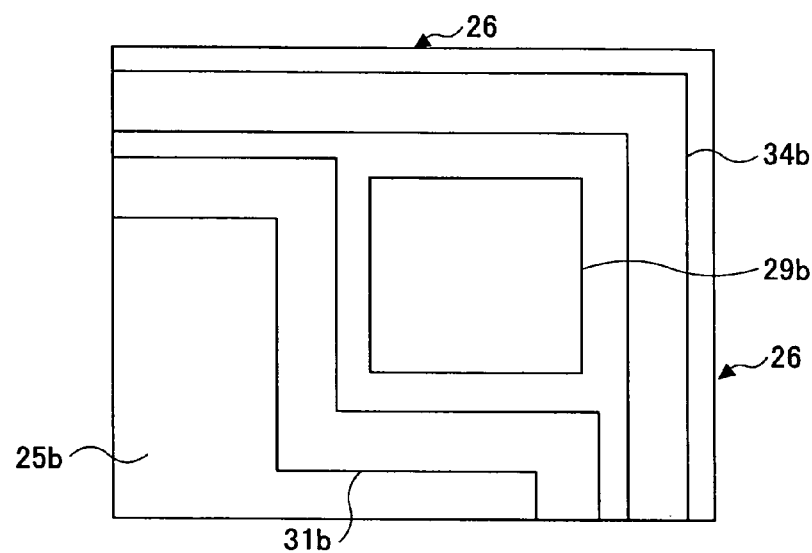
Figure 6C:
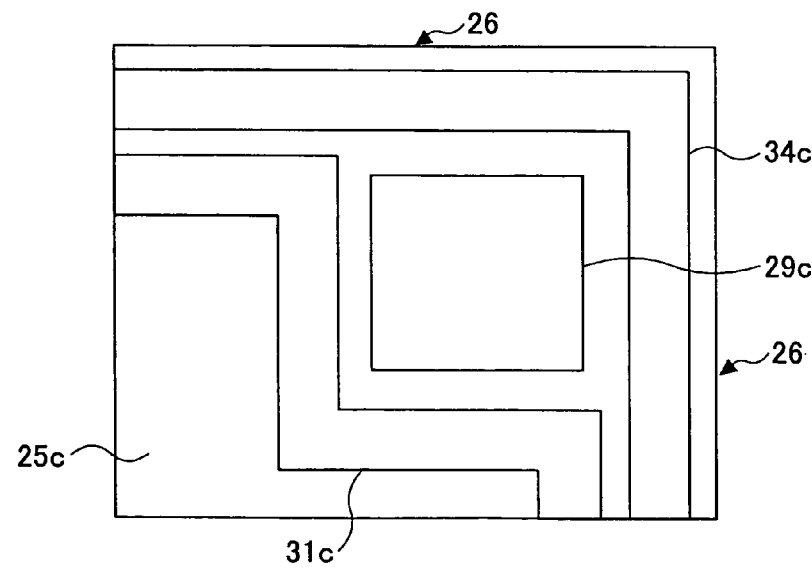

FIGS. 6A–6C are plan view diagrams showing the respective layers in the peripheral part of the semiconductor device 10 in an enlarged scale.

Referring to FIGS. 6A–6C, it should be noted that the guard ring pad 31 is formed on the surface of any of the first through third interlayer insulation films 25 with the pattern as shown in FIGS. 6A–6C.

Thus, as shown in FIG. 6A, a guard ring pad 31a of the first layer forms a conductive band having a width of 1.0–5.0 µm at a side of the conductive pad 29a closer to the circuit part 11, wherein it is preferable to form the guard ring pad 31a such that the guard ring pad 31a extends close to the conductive pad 29a in conformity with the shape of the conductive pad 29a. With this, it becomes possible to reduce the volume of the interlayer insulation film 25 that contains water and hence the potential amount of water that may flow into the circuit part 11 along the periphery of the electrode pad 12. Further, it becomes possible to maximize the effective area of the circuit part 11 usable for formation of the active elements. In the construction of FIG. 6A, it should be noted that the guard ring pad 31*a* is disconnected at the part where the interconnection pattern 15*a* extends. With this, it is possible to avoid dissipation of electric signals on the interconnection pattern 15*a* to the guard ring pad 31*a*.

In the second and third interlayer insulation films 25*b* and 25*c*, on the other hand, the guard ring pad 31*a* on the interlayer insulation film 25*b* and the guard ring pad 31*c* on the interlayer insulation film 25*c* are formed in the band-like form at the side closer to the circuit part 11 with respect to the conductive pad 29*b* or 29*c* similarly to the guard ring pad 21*a* but without a disconnection part. Further, similarly to the case of the guard ring pad 29*a* of the first layer, it is preferable to form the guard ring pads 31*b* and 31*c* as close as possible to the corresponding conductive pads 29*b* and 29*c* respectively. Further, the guard ring pad 29*c* of the third layer is covered with the passivation film 28.

The guard ring pads 31*a*–31*c* may be formed of any material as long as the material blocks penetration of moisture, and thus, materials such as metal, alloy, silicon nitride, and the like, may be used. Particularly, by using the same material for the conductive pads, it is possible to form the guard ring pad simultaneously with the conductive pads and the number of the fabrication steps of the semiconductor device 10 is reduced.

Referring back to FIGS. 4 and 5, it is noted that the guard ring contact 32 connects the surface of the semiconductor substrate 21 and the guard ring pad 31*a* and forms a continuous, wall-like pattern except for the part where the guard ring pad 31*a* is disconnected by the interconnection pattern 15*a*-1. Similarly to the contact plugs 18 in the circuit part 11, the guard ring contact is formed of a lamination of a Ti/TiN film and a tungsten film.

Further, the guard ring plugs 33*b* and 33*c* extend through the second and third interlayer insulation films 25*b* and 25*c* continuously to form a continuous, wall-like pattern similarly to the ring contact 32, wherein the each of the guard ring plugs 33*b* and 33*c* connects the upper and lower guard ring pads 31*a*, 31*b* and 31*c* except that the guard ring plug 33 is disconnected in the vicinity of the interconnection pattern 15*a*-1, similarly to the guard ring pad 31*a*. Thereby, short circuit to the interconnection pattern 15*a*-1 is prevented.

By forming the guard ring plug 33 to have a width smaller than that of the guard ring pad 31, it is possible to ensure the connection of the guard ring plug 33 to the guard ring pad 31.

The first guard ring 13 thus formed extends continuously so as to surround the circuit part 11 except for the part corresponding to the interconnection 15*a*-1 (the guard ring contact 32 and the guard ring plug 33*b* above and below the interconnection pattern 15*a*-1 as represented in FIG. 5 by broken line), and thus, penetration of moisture from the sidewall surface 26 to the circuit part 11 through the first through third interlayer insulation films 25 is more or less completely blocked. Further, the moisture penetrated through the gap between the electrode pad 12 and the interlayer insulation film 25 is almost completely blocked from reaching the circuit part 11.

Further, it should be noted that the second water-blocking guard ring 14 is disposed between the electrode pad 12 and the sidewall surface 26 of the semiconductor device 10 in the construction of the present embodiment such that the second water-blocking guard ring surrounds the circuit part 11 via the first guard ring 13 and the electrode pads 12. Similarly to the first guard ring 13, the second guard ring 14 is formed of a guard ring pad 34, a guard ring contact 35 and a guard ring plug 36, wherein detailed description thereof will be omitted, as the material and size are more or less the same as the first guard ring 13.

By providing the second guard ring 14, the moisture penetrated from the sidewall surface 26 of the semiconductor device 10 is blocked from reaching the circuit part 11 through the first through third interlayer insulation films 25. This water-blocking effect of the second water-blocking guard ring 13 is particularly beneficial in view of the fact that the first water-blocking guard ring 13 is disconnected at the first layer interconnection pattern 15*a*-1 formed in the second interlayer insulation film 25*b*. It should be noted that this second water-blocking guard ring 14 is not mandatory and can be omitted.

The first through third interlayer insulation films 25 are formed by sputtering or CVD of silicon oxide. Alternatively, these interlayer insulation films may be formed by a CVD process that uses TEOS for the source material. Further, it is possible to provide a barrier layer such as a silicon oxynitride layer that blocks penetration of water on the first through third interlayer insulation films as will be explained with reference to the second embodiment. Further, the passivation film 28 is formed of a non-permeable layer such as a silicon nitride film or a polyimide film. Further, it is possible to use a passivation film to be explained with reference to the third embodiment for the passivation film 28. Thereby, penetration of water from the electrode pad can be prevented more effectively.

Further, it is possible to provide an alumina layer on the surface of the first through third interlayer insulation films 25 or to cover the interconnection layers 15. Thereby, it becomes possible to interrupt the moisture penetrated from the region near the electrode pad 12 effectively.

According to the present embodiment, degradation of the elements such as transistors, particularly the degradation of ferroelectric capacitors, is prevented by forming the first water-blocking guard ring between the circuit part and the electrode pads such that the first water-blocking guard ring surrounds the circuit part.

Further, it should be noted that the present invention is not limited to ferroelectric memory devices but is applicable also to other semiconductor devices such as random access memory devices including SRAMs and DRAMs, read-only memory devices including EPROMs and flash memories, and CPUs.

Second Embodiment

Figure 7:
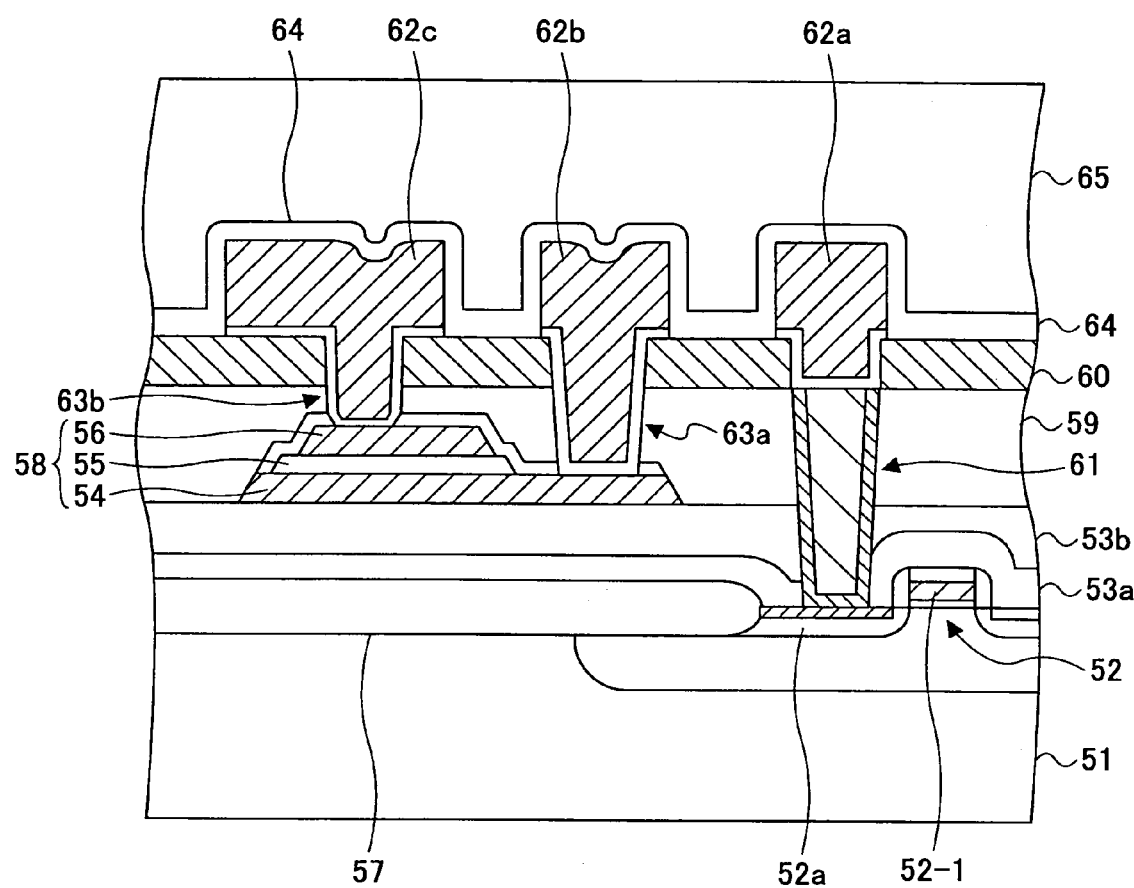
FIG. 7 is a cross-sectional diagram showing the construction of a semiconductor device according to a second embodiment of the present invention.

FIG. 7 is a cross-sectional diagram of a semiconductor device 50 according to a second embodiment of the present invention.

Referring to FIG. 7, the semiconductor device 50 is a ferroelectric random access memory constructed on a semiconductor substrate 51 and includes a transistor 52 formed on the semiconductor substrate 51, insulation films 53*a* and 53*b* covering the transistor 52, a ferroelectric capacitor 58 formed in the insulation film 53*b* and including sequential stacking of a lower electrode 54, a ferroelectric capacitor insulation film 55 and an upper electrode 56. Further, there is provided a first interlayer insulation film 59 so as to cover the ferroelectric capacitor 58 and a barrier layer 60 is formed on the first interlayer insulation film 59.

Further, an interconnection layer 62 is formed in the barrier layer 60, wherein the interconnection layer 62 includes an interconnection pattern 62*a* connected to a diffusion region 52a of the transistor 52 via a contact plug 61 as well as interconnection patterns 62b and 62c connected respectively to the lower electrode 54 and the upper electrode via plugs 63a and 63b, respectively.

Further, the surface of the barrier layer 60 and the interconnection patterns 62a–62c are covered with an insulating metal oxide layer 64.

The semiconductor device 50 forms a ferroelectric random access memory of 1T1C type, for example, and the interconnection pattern 62b connected to the lower electrode 54 serves for a plate line, while the upper electrode 56 is connected to the diffusion region 52a of the transistor 52 via the interconnection pattern 62b. Further, the transistor 52 includes a gate electrode 52-1 serving also as a word line, and a bit line is connected to another diffusion region of the transistor 52 although not illustrated.

The ferroelectric capacitor insulation film 55 constituting the ferroelectric capacitor 58 is formed of a ferroelectric oxide having a perovskite crystal structure such as PZT, PLZT ((Pb,La) (Zr,Ti)O$_3$), SBT, and the like. Such perovskite ferroelectric oxide has the feature of large residual dielectric polarization and large specific dielectric constant, and the use thereof is advantageous also in terms of retention characteristics and fatigue characteristics.

On the other hand, such ferroelectric oxides have a drawback in that oxygen defects are tend to be formed, when moisture penetration has been caused, by hydrogen atoms formed as a result of decomposition of water. As a result of degradation of crystallinity associated with such formation of oxygen defects, the residual dielectric polarization and the specific dielectric constant of the ferroelectric oxide are deteriorated seriously.

Further, it should be noted that, in the semiconductor device 50 of FIG. 7, the lower electrode 54 and the upper electrode 56 are formed of a platinum group metal element such as Pt, Ir, Ru, and the like, or a conductive oxide such as IrO$_2$, RuO$_2$, and the like, or a lamination of these.

The first interlayer insulation film 59 is formed for example of a silicon oxide film formed by a sputtering process or CVD process with the thickness of 500 nm, wherein the silicon oxide film may be the one called PSG film, BSG film or AsSG film doped with P, B or As. In the description hereinafter, the silicon oxide film thus doped with impurity element will also be designated as "silicon oxide film".

It should be noted that the barrier layer 60 is formed of a silicon oxynitride film formed by a sputtering process or CVD process or a silicon oxynitride film converted from a silicon oxide film by an oxynitriding processing. It should be noted that a silicon oxynitride film has the function of blocking water, and thus, the barrier layer 60 of silicon oxynitride provided on the surface of the semiconductor device 50 can effectively block the penetration of moisture into the ferroelectric capacitor 58 through the barrier layer 60 from the upward direction. As a result, the problem of oxygen defect formation in the ferroelectric capacitor insulation film 55 by the hydrogen atoms formed by decomposition of water is effectively resolved.

Figure 8:
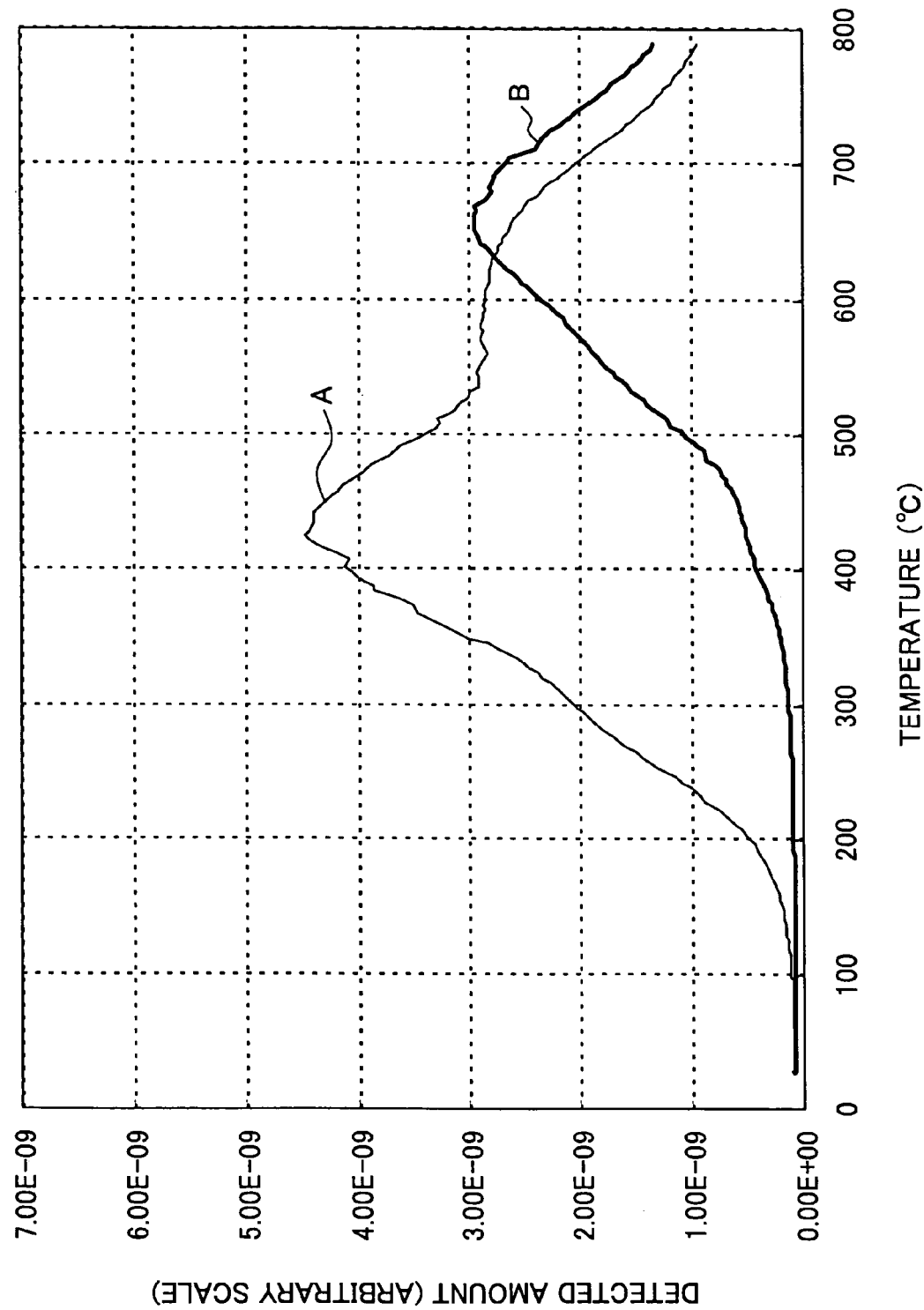
FIG. 8 is a diagram explaining the moisture blocking performance of a silicon oxynitride film.

FIG. 8 is a diagram showing the performance of an silicon oxynitride film as a water blocking barrier.

Referring to FIG. 8, the water molecules released from the surface of samples A and B were measured by a DTA (differential thermal analysis)-mass spectroscopy while increasing the temperature of the samples A and B with a predetermined rate.

More specifically, the sample A has a construction in which a PSG film containing P (phosphorus) with a concentration of 5 weight percent is formed on a silicon wafer with a thickness of 500 nm, while the sample B is formed from the sample A by processing the surface of the PSG film of the sample A by a plasma oxynitridation processing for 4 minutes while using an N$_2$O gas. Thus, sample B has a P-containing silicon oxynitride film on the surface of the PSG film.

Referring to FIG. 8, it can be seen that release of water is detected at the temperature of about 120° C. in the case of the sample A and water release becomes maximum at the temperature of about. 420° C. With further increase of the sample temperature, the water release rate is decreased gradually.

In the case of the sample B in which the surface of the sample A is thus converted to a P-containing silicon oxynitride film, no water is detected in the temperature range of 120–350° C. This means that water contained in the PSG film is completely blocked by the P-containing silicon oxynitride film in the temperature range lower than 350° C. Further, it is noted that the amount of release of water is small also in the temperature range above 350° C. up to the temperature of 460° C. Thus, it is concludes that the oxynitride film has sufficient performance of water blocking at the temperature range of 460° C or less.

Further, while it is not directly clear from FIG. 8 about the water blocking barrier performance of the P-containing silicon oxynitride film in the temperature range of 20–120° C., it is believed from the relationship of FIG. 8 showing the excellent water blocking barrier performance in the temperature range of 120–350° C. that the P-containing silicon oxynitride film shows also excellent water blocking barrier performance also in this temperature range.

Thus, by conducting the process steps after the step of forming the barrier layer 60 of P-containing silicon oxynitride film at the temperature of 460° C. or less, it becomes possible to prevent degradation of the ferroelectric capacitor 58 caused by penetration of moisture.

FIG. 9 is another diagram for explaining the water blocking barrier performance of the silicon oxynitride film.

Referring to FIG. 9, the sample C has a construction in which a silicon oxide film is formed on a silicon wafer with a thickness of 500 nm by a plasma CVD process while using TEOS as a source, while the sample D has a construction in which a silicon oxynitride film is formed on the silicon oxide film of the sample C by a CVD process with the thickness of 50 nm. Further, the sample E is the one in which the thickness of the silicon oxynitride film of the sample D is increased to 100 nm. It should be noted that these silicon oxide film and silicon oxynitride film are formed under the condition used in the process steps of FIGS. 11A and 11B for fabricating a semiconductor device as will be described later.

Referring to FIG. 9, it can be seen that release of water is detected at the temperature of about 120° C. in the case of the sample C and the amount of release becomes maximum at the temperature of about 350° C. With further increase of the temperature, the amount of release decreases gradually, while when the temperature of 600° C. is exceeded, the amount of water release starts to increase again.

In the case of the samples D and E, on the other hand, no water release is detected in the entire temperature range of 30–780° C. This clearly shows that the silicon oxynitride film blocks the water release that has been detected in the case of the sample C. In view of the thickness of 50 nm of the silicon oxynitride film in the sample D, it is concluded that the silicon oxynitride film shows excellent performance of water blocking barrier even when the silicon oxynitride film is formed with a reduced thickness.

In conclusion, it is possible to block the penetration of moisture into the semiconductor device 50 and prevent the degradation of the ferroelectric capacitor 58 by forming a silicon oxynitride film on the first interlayer insulation film 59. Further, such a silicon oxynitride can be used also for preventing oxidation of contacts at the time of the etching process as will be explained later.

FIGS. 10A–10C, 11A–11C and 12 are diagrams for explaining the fabrication process of a semiconductor device according to an embodiment of the present invention.

Figure 10A:
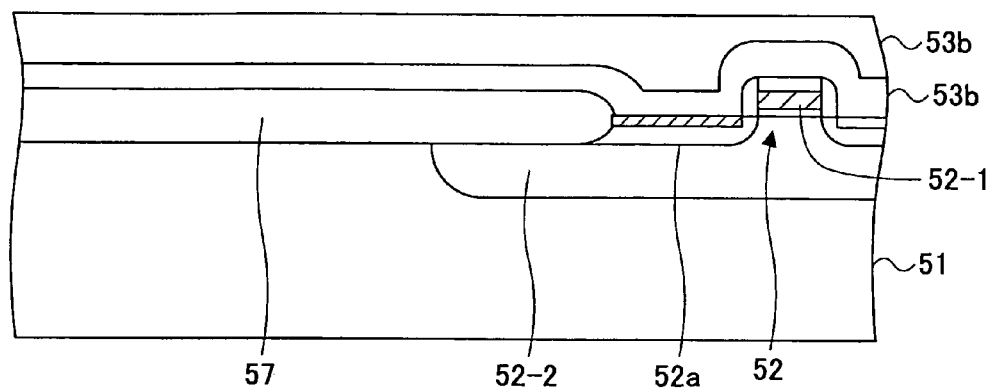
FIGS. 10A–10C are diagrams for explaining the fabrication process of the semiconductor device according to a second embodiment of the present invention.

Referring to FIG. 10A, the transistor 52 is formed on the semiconductor substrate 51 by forming a device isolation region 57, a well 52-2, and the like, in addition to the diffusion region 52a and the gate electrode 52-1, which functions also as a word line, and the insulation films 53a and 53b are formed so as to cover the semiconductor substrate 51, the device isolation region 57 and the transistor 52. Fabrication of the transistor 52 can be achieved by any know process and the description thereof ill be omitted. Further, the surface of the insulation film 53b may be subjected to a planarization processing by a CMP process. With this, formation of crystal grain boundary in the lower electrode 54 and the ferroelectric capacitor insulation film 55 of the ferroelectric capacitor 58 formed in the next process is suppressed and the crystallinity of the ferroelectric capacitor insulation film 55 is improved.

Figure 10B:
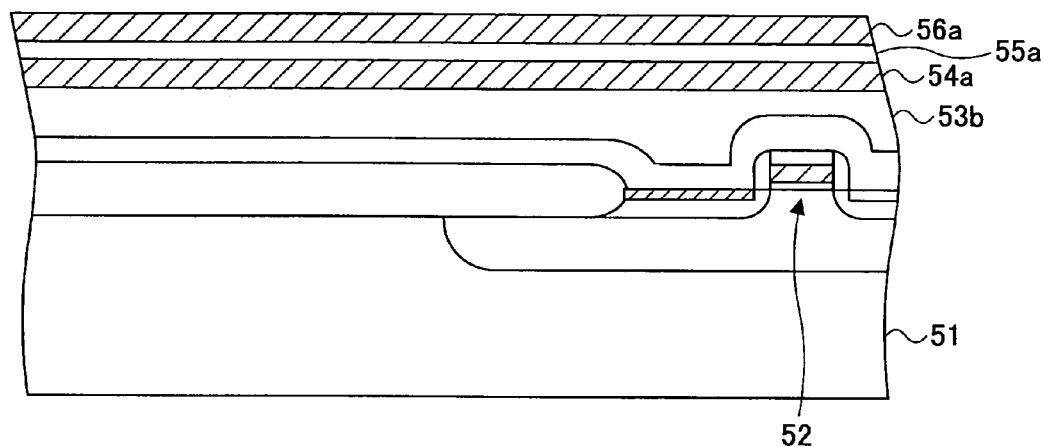

Next, in the step of FIG. 10B, a lower electrode layer 54a, a ferroelectric film 55a and an upper electrode layer 56a are formed consecutively on the structure of FIG. 10A, wherein the lower electrode layer 54a may be formed by a sputtering process or vacuum evaporation deposition process of a platinum group element such as Ru, Rh, Pd, Os, Ir, Pt or an alloy of these, or a conductive oxide such as $IrO_2$, $RuO_2$, $SrRuO_3$, and the like. Thereby, the lower electrode layer 54a may be formed in a laminated body of any of these platinum group elements, alloy and the conductive oxide. Typically, the lower electrode layer 54a is formed to have a thickness of 100 nm.

The ferroelectric film 55a is formed of a ferroelectric oxide film such as a PZT film, a PLZT film or an SBT film formed by a sputtering process, MOCVD process, sol-gel process, MOCVD process, and the like. In the case of using a PZT film or a PLZT film, Pb is added with an amount exceeding the stoichiometric composition in advance in view of the tendency of easy escaping of the Pb atoms. For example, the ferroelectric film 55a may be deposited in the form of a PZT film having a thickness of 200 nm by an RF sputtering process while using a sputtering target containing excess amount of Pb. Thereafter, the PZT film thus deposited is annealed in oxygen ambient while using a halogen lamp annealing apparatus, and the like.

The upper electrode layer 56a may be formed of the same material as the lower electrode layer 54a. Particularly, it is preferable to use $IrO_2$, $RuO_2$ or $SrRuO_3$ with the thickness of 100 nm, for example.

Figure 10C:
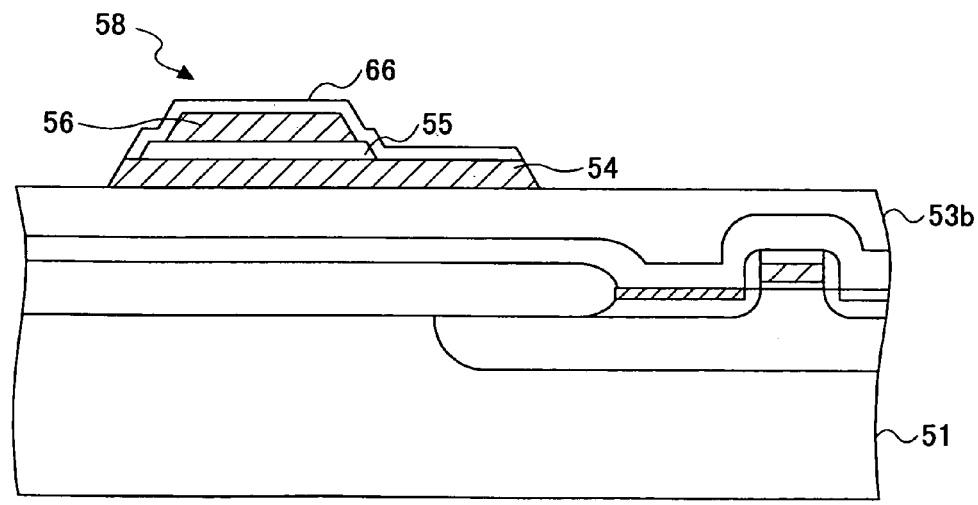

Next, in the step of FIG. 10C, the upper electrode layer 56a is patterned and the upper electrode 56 of the ferroelectric capacitor 58 is thus formed, followed by patterning the ferroelectric film 55a to form the ferroelectric capacitor insulation film 55. Further, the ferroelectric capacitor insulation film 55 and the upper electrode 56 are annealed in oxygen ambient for recovering the damages formed in the ferroelectric capacitor insulation film 55 at the time of the patterning process. At the same time, the water contained in the insulation films 53a and 53b are evaporated as a result of the annealing process.

In the step of FIG. 10C, there is further formed a capacitor protection film 66 by a sputtering process such that the capacitor protection film 66 covers the surface and the sidewall surface of the lower electrode layer 54a, the ferroelectric capacitor insulation film 55 and the upper electrode 56. For the capacitor protection film 66, an alumina film, a $TiO_2$ film, a PZT film, and the like, can be used.

Next, the capacitor protection film and the lower electrode layer 54a are patterned to form the lower electrode 54. Thereby, the capacitor protection film 66 prevents penetration of water or hydrogen into the ferroelectric capacitor insulation film 55.

Figure 11A:
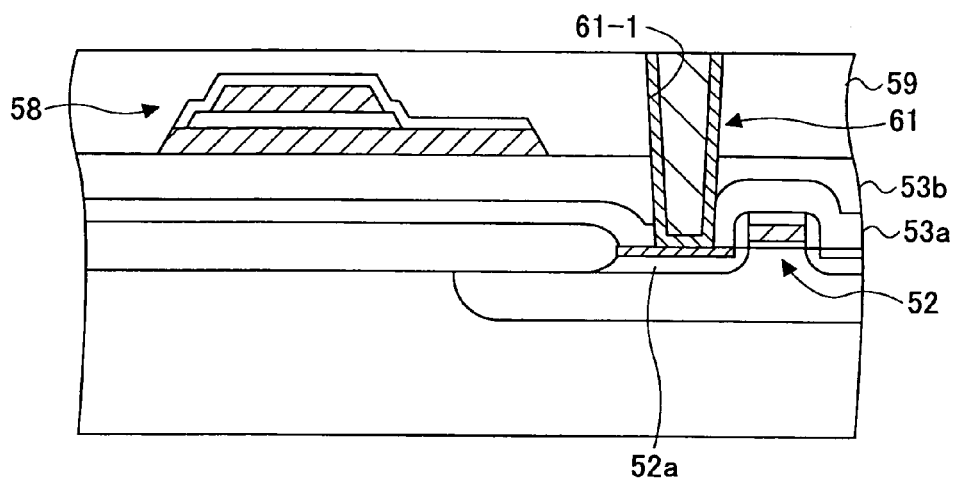
FIGS. 11A–11C are further diagrams for explaining the fabrication process of the semiconductor device according to the second embodiment of the present invention.

Next, in the step of FIG. 11A, the first interlayer insulation film 59 of silicon oxide if formed by a sputtering process or CVD process with a thickness of 100 nm so as to cover the structure of FIG. 10C, wherein the surface of the interlayer insulation film 59 is subjected to a planarization processing by a CMP process.

For example, the silicon oxide film forming the interlayer insulation film 59 is formed by a plasma CVD process at the substrate temperature of 330–400° C. while supplying TEOS and oxygen as the film formation gases together with a carrier gas of He. In this process, it is preferable to add excess amount of oxygen in view of formation of water simultaneously to the formation of the silicon oxide film. The water thus formed is incorporated into the silicon oxide film. The oxygen gas flow rate may be set twice as large as the oxygen gas flow rate used in the conventional film formation process. Further, it is possible to use silane or a polysilane compound such as $Si_2F_6$, $Si_3F_8$, $Si_2F_3Cl$, and the like.

In this process of forming the interlayer insulation film 59, it is possible to conduct an annealing process at the temperature of 300–350° C. such that the water content in the film 59 is evaporated. Such an annealing process is typically conducted by a halogen lamp annealing apparatus in oxygen ambient.

In the step of FIG. 11A, a resist pattern not illustrated is formed on the first interlayer insulation film 59 and a contact hole 61-1 is formed in the interlayer insulation film 59 by a patterning process while using the resist pattern as a mask, such that the contact hole 61-1 penetrates through the first interlayer insulation film 59 and the insulation films 23a and 53b and exposes the diffusion region 52a of the transistor 52.

Next, a Ti film and a TiN film are formed consecutively on the inner wall surface of the contact hole 61-1 and the first interlayer insulation film 59 by a sputtering process with respective thicknesses of 20 nm and 50 nm, and the contact hole 61-1 thus processed is filled with a tungsten (W) film formed by a sputtering process or a CVD process. Thereby, the W film is formed with a thickness of 100 nm on the first interlayer insulation film 59 such that the W film completely fills the contact hole. Thereafter, the TiN film, the TiN film and the W film on the first interlayer insulation film 59 are removed by a CMP process, and with this, the contact plug 61 is formed.

Figure 11B:
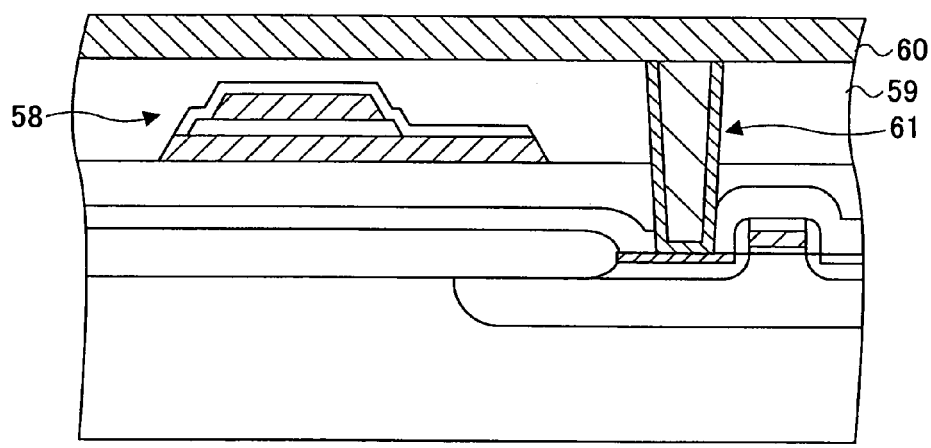

Next, in the step of FIG. 11B, the barrier layer 60 is formed on the structure of FIG. 11A by a sputtering process or CVD process with the thickness of 50–500 nm, for example. As noted previously, a silicon oxynitride film can be used for the barrier layer 60 in view of the excellent performance as a water blocking barrier, wherein the silicon oxynitride film may be formed by any of the foregoing two methods. In the present example, the silicon oxynitride film is formed by a plasma CVD process while using a silane gas and an $N_2O$ gas for the film forming gas. In view of etching caused in the barrier layer 60 at the time of patterning process of interconnection layers conducted later, it is preferable to form the barrier layer 60 with increased thickness as compared with the nominal thickness.

Figure 11C:
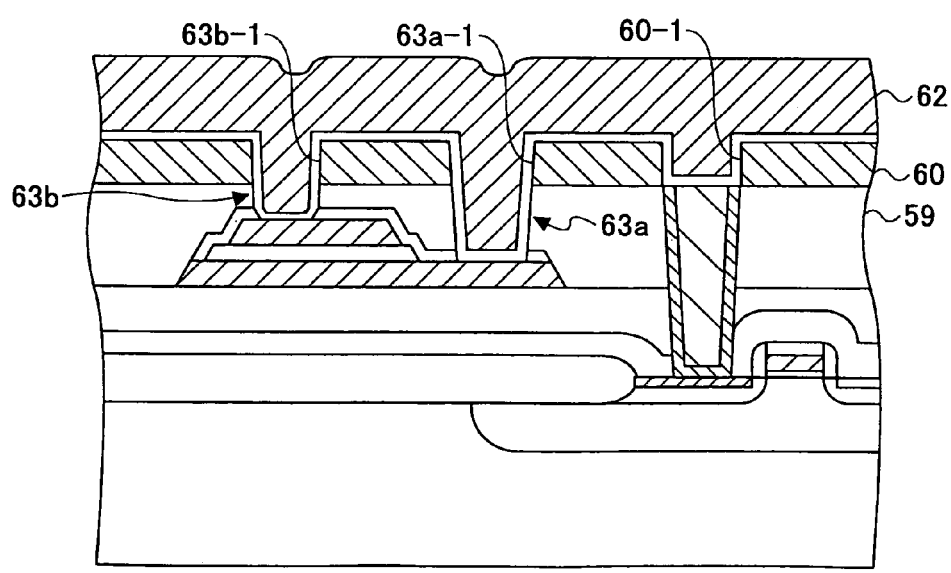

Next, in the step of FIG. 11C, openings 63a-1, 63b-1 and 60-1 are formed through the barrier layer 60, the first interlayer insulation film 59 and the capacitor protection film 66 while using a resist pattern (not shown) formed on the barrier layer 60 as a mask, such that a part of the lower electrode 54, a part of the upper electrode 56 and the surface of the contact plug 61 are exposed.

In the step of FIG. 11C, a TiN film is formed further by a sputtering process so as to cover the inner surface of the openings 63a-1, 63b-1 and 60-1 with a thickness of 100 nm, followed by the step of filling the openings 63a-1, 63b-1 and 60-1 by a sputtering process or CVD process of an aluminum film 62 with the thickness of 500 nm, for example. Further, the film 62 is formed on the barrier layer 60.

Figure 12:
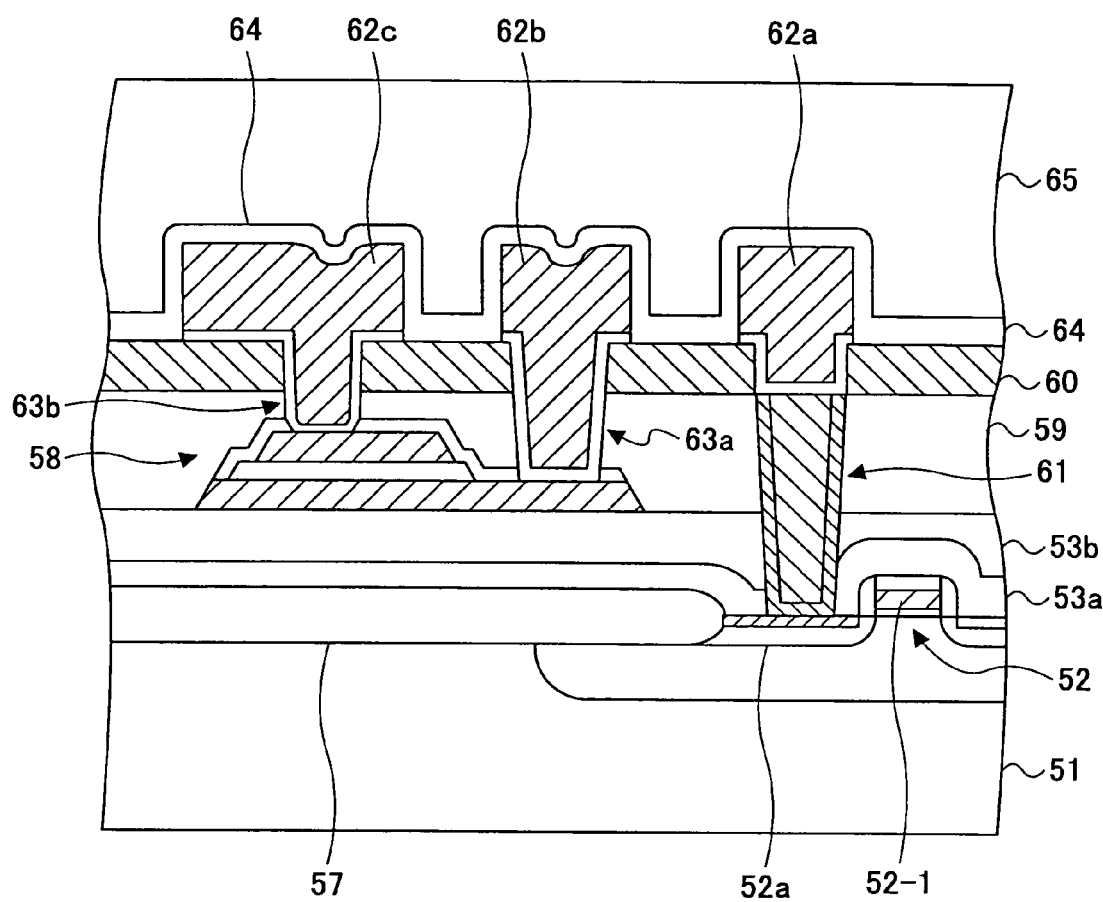
FIG. 12 is a further diagram for explaining the fabrication process of the semiconductor device according to the second embodiment of the present invention.

Next, in the step of FIG. 12, the aluminum film 62 is patterned by a photolithographic process and the interconnection patterns 62a–62c are formed. Next, the insulating metal oxide film 64 is formed so as to cover the surface and sidewall surface of the barrier layer 60 and the interconnection patterns 62a–62c. The insulating metal oxide film 64 may be formed of an alumina film or a TiO2 film and is formed with the thickness of 10–300 nm, preferably 20–70 nm. By using such an insulating metal oxide film 64, it is possible to block the penetration of moisture into the ferroelectric capacitor 58. Such an alumina film or $TiO_2$ film may be formed by a sputtering method while using a sputtering target of alumina or $TiO_2$ or by an MOCVD process conducted at the substrate temperature of 400° C. while supplying an organic aluminum source such as $Al(i-OC_3H_7)_3$ and a nitrogen gas.

In the step of FIG. 12, there is further conducted a process for forming the second interlayer insulation film of silicon oxide such that the second interlayer insulation film 65 covers the insulating metal oxide film 64 with the thickness of 700 nm. Thereafter, various plugs are formed in the second interlayer insulation film so as to penetrate therethrough and to connect the interconnection patterns 62a–62c with upper interconnection patterns such as bit lines formed on the interlayer insulation film 65. After formation of the electrode pads and passivation films, fabrication of the semiconductor device 50 is completed.

Thus, the semiconductor device of the present embodiment uses the barrier layer 60 of silicon oxynitride or the like having excellent water blocking barrier performance on the first interlayer insulation film 59 that covers the ferroelectric capacitor, and thus, it becomes possible to block the water or moisture penetrating from the region above the barrier layer 60. Thereby, degradation of performance of the ferroelectric capacitor is prevented even when a severe test such as PTHS test is conducted, and the semiconductor device shows excellent long-time reliability.

Figure 13:
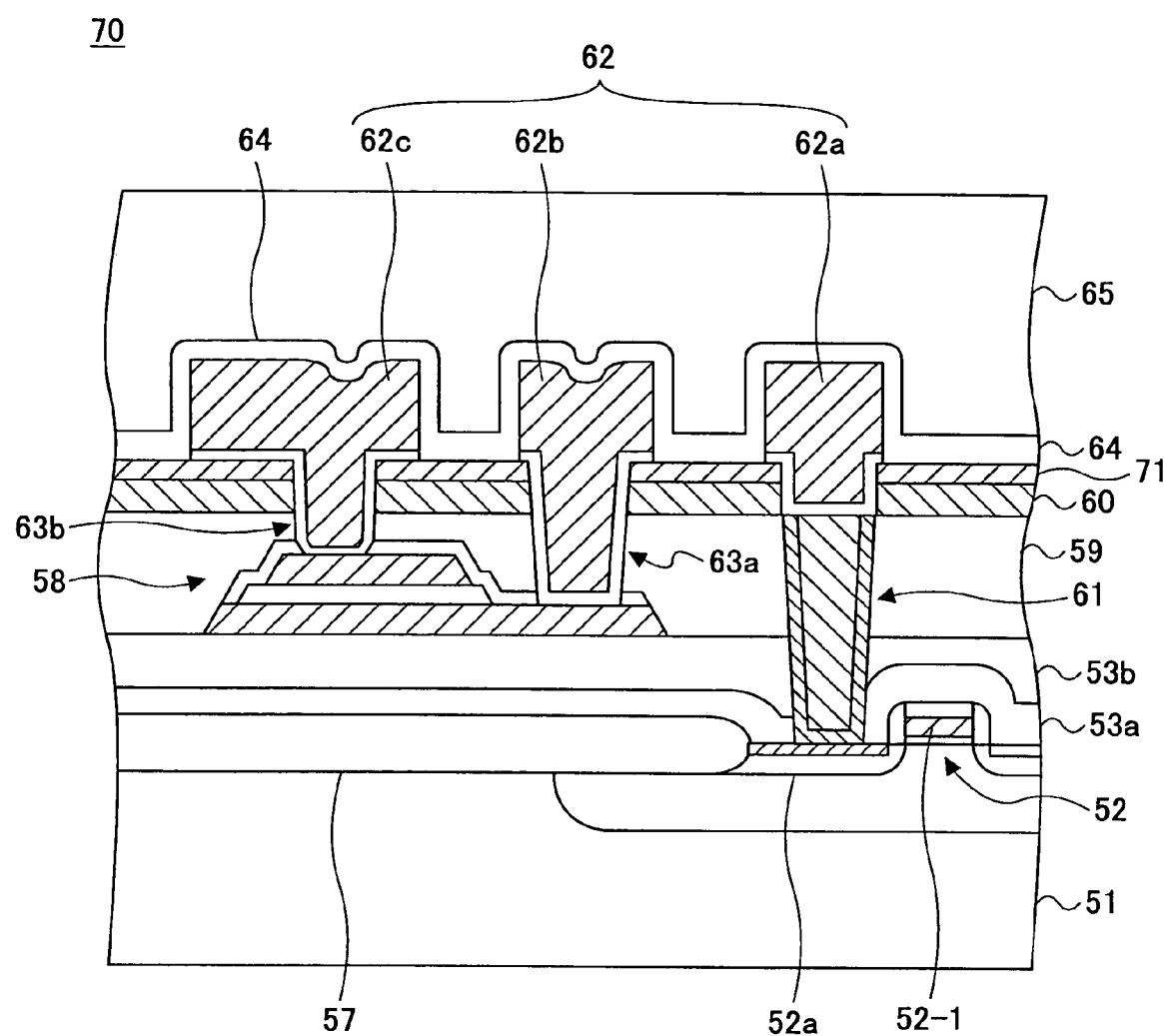
FIG. 13 is a cross-sectional diagram showing a semiconductor device according to a modification of the second embodiment.

FIG. 13 is a cross-sectional diagram of a semiconductor device 70 according to a modification of the semiconductor device of the second embodiment, wherein those parts corresponding to the parts described previously are designated by the same reference numerals and the description thereof will be omitted.

Referring to FIG. 13, the semiconductor device 70 has a construction similar to that of the semiconductor device 50 of the second embodiment except that a silicon oxide film 71 of TEOS CVD process is formed on the barrier layer 60.

More specifically, the silicon oxide film 71 on the barrier layer 60 is formed by a plasma CVD process while using a TEOS gas and an oxygen gas as the film forming gases with the thickness in the range of 50–500 nm. With this, plasma formation is facilitated substantially at the time of sputtering an aluminum film on the barrier layer 60 for forming the plugs 63a and 63b and the interconnection pattern 62. Because plasma formation is thus stabilized as a result of formation of the silicon oxide film 71, it becomes possible to form the aluminum film 62 uniformly in the step of FIG. 11C, and the wiring resistance or variation of the wiring resistance is minimized for the aluminum patterns 62a–62c.

EXAMPLE 1

In Example 1, a ferroelectric random access memory is formed according to the process of the present invention wherein the ferroelectric random access memory of Example 1 has a structure similar to the one shown in FIG. 7.

More specifically, the ferroelectric capacitor is formed by a sputtering process to have the structure in which the Pt lower electrode 54, the PZT ferroelectric capacitor insulation film 55 and the IrO2 upper electrode 56 are stacked consecutively with respective thicknesses of 100 nm, 200 nm and 100 nm, wherein the first insulation film 59 is formed by a plasma CVD process to have the thickness of 100 nm by setting the substrate temperature to 350° C. while supplying a TEOS gas and an oxygen gas with respective flow rates of 466 SCCM and 700 SCCM under a pressure of $1.2 \times 10^3$ Pa (9.0 Torr).

After formation, the first interlayer insulation film 59 is subjected to a CMP process for planarization, and the barrier layer 60 is formed further thereon by depositing a silicon oxynitride film by a plasma CVD process with the thickness of 200 nm at the substrate temperature of 340° C. while supplying a silane gas and an $N_2O$ gas as the source gases. After patterning of the interconnection pattern 62, the silicon oxynitride film constituting the barrier layer 60 may have a thickness of 100 nm. Further, the insulating metal oxide film 64 is formed by an alumina film to have a thickness of 50 nm.

EXAMPLE 2

In Example 2, the semiconductor device is formed similarly to the case of Example 1 except that the TEOS silicon oxide film forming the first interlayer insulation film 59 is formed to have a thickness of 300 nm, such that the fist interlayer insulation film 59 has the final film thickness of 200 nm. Otherwise, Example 2 is identical with Example 1.

EXAMPLE 3

In Example 3, the semiconductor device is formed similarly to the case of Example 1 except that the oxygen gas flow rate used at the time of forming the silicon oxide film of the first interlayer insulation film 59 by the TEOS CVD process is set to 140 sccm.

EXAMPLE 4

In Example 4, the semiconductor device is formed similarly to the case of Example 1 except that a silicon oxide film is formed on the barrier layer 60 of silicon oxynitride in correspondence to the silicon oxide film 71 of FIG. 13 by a TEOS plasma CVD process with the thickness of 50 nm. Thereby, the silicon oxide film 71 is formed under the condition similar to that of the silicon oxynitride film 60. Because of the formation of the silicon oxide film 71, the barrier layer 60 underneath maintains the initial thickness of 200 nm even when the patterning process of the interconnection pattern 62 is conducted.

COMPARATIVE EXAMPLE 1

In Comparative Example 1, the semiconductor device is formed similarly to Example 1 except that there is formed no barrier layer 60 of silicon oxynitride.

COMPARATIVE EXAMPLE 2

In Comparative Example 2, the semiconductor device is formed similarly to Example 1 except that there is formed no insulating metal oxide layer 64 of alumina.

Figure 14:
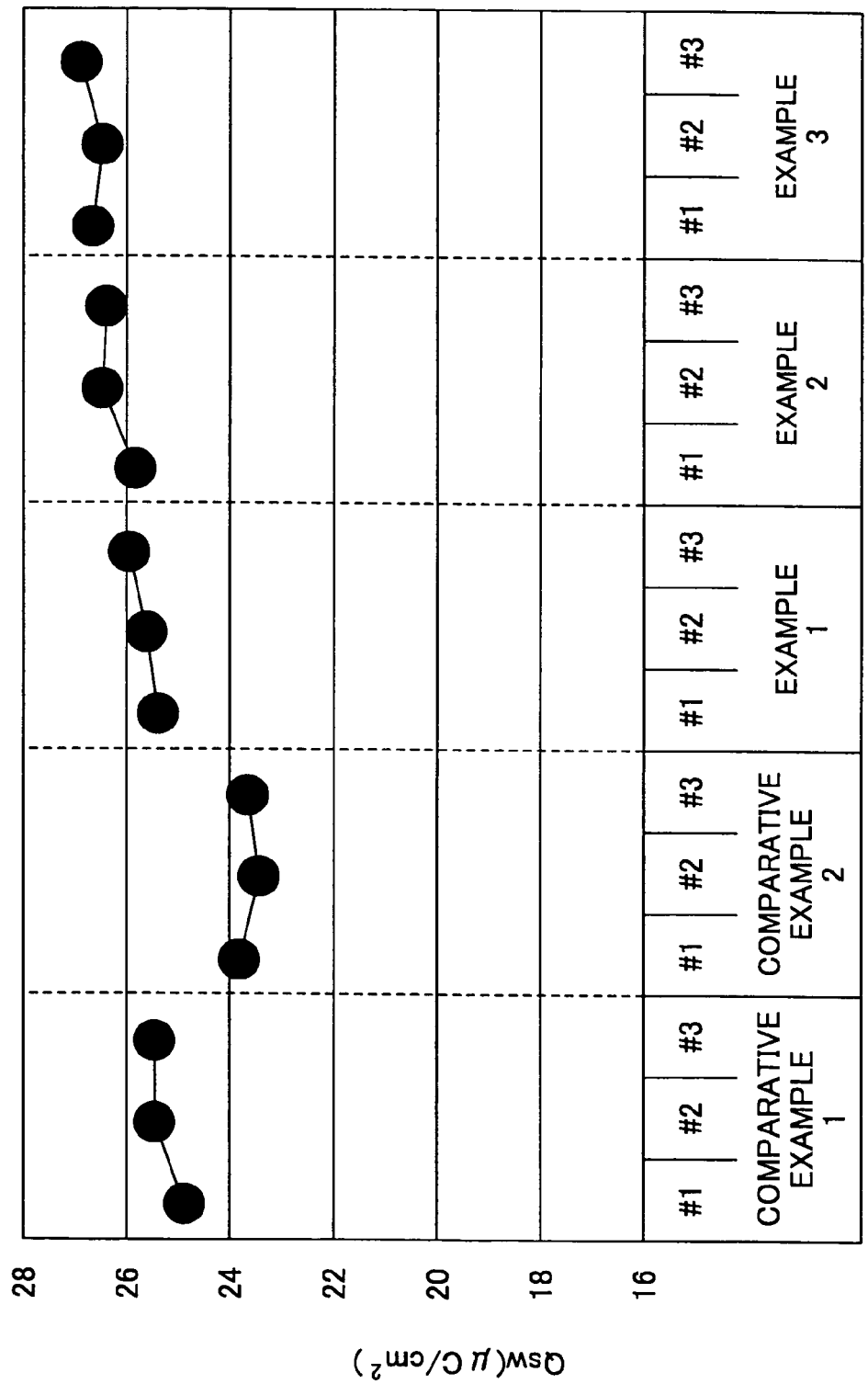
FIG. 14 is a diagram showing the switching electric charge $Q_{SW}$ for the present embodiment and a comparative example.

FIG. 14 shows the switching electric charge $Q_{SW}$ of the ferroelectric capacitor constituting the ferroelectric random access memory devices of Examples 1–3 and Comparative Examples 1–2. Here, it is known that the larger the value of $Q_{SW}$, the higher the pass rate of operational characteristics after the PTHS test. Thus, the samples providing higher $Q_{SW}$ values provide higher long-term reliability. In FIG. 14, the PTHS test has been conducted at the temperature of 121° C. under 100% RH humidity and under the pressure of $2.03 \times 10^5$ Pa for the duration of 168 hours.

Referring to FIG. 14, it can be seen that the $Q_{SW}$ value is increased with the case of Examples 1–3 as compared with Comparative Examples 1 and 2. Thus, it is concluded that the long-term reliability of the ferroelectric memory device is improved by forming the silicon oxyni8tride film on the first interlayer insulation film 59 as the barrier layer 60.

Further, FIG. 14 shows that the value of $Q_{SW}$ is increased with increasing thickness of the silicon oxynitride film. Further, the value of $Q_{SW}$ increases when excess oxygen gas is added to the TEOS gas at the time of formation of the silicon oxide film, as can be seen in the case of Example 3. This represents that the influence of water moisture on the ferroelectric capacitor is suppressed as a result of decrease of water content of the silicon oxide film.

Here, it should be noted that the value of $Q_{SW}$ is obtained by summing the magnitude of positive and negative residual dielectric polarizations obtained by applying positive and negative voltages (about 5V in magnitude) set sufficient to cause saturation of polarization in the PZT film 55 via the capacitor electrodes 54 and 56 of the ferroelectric capacitor 58.

Figure 15:
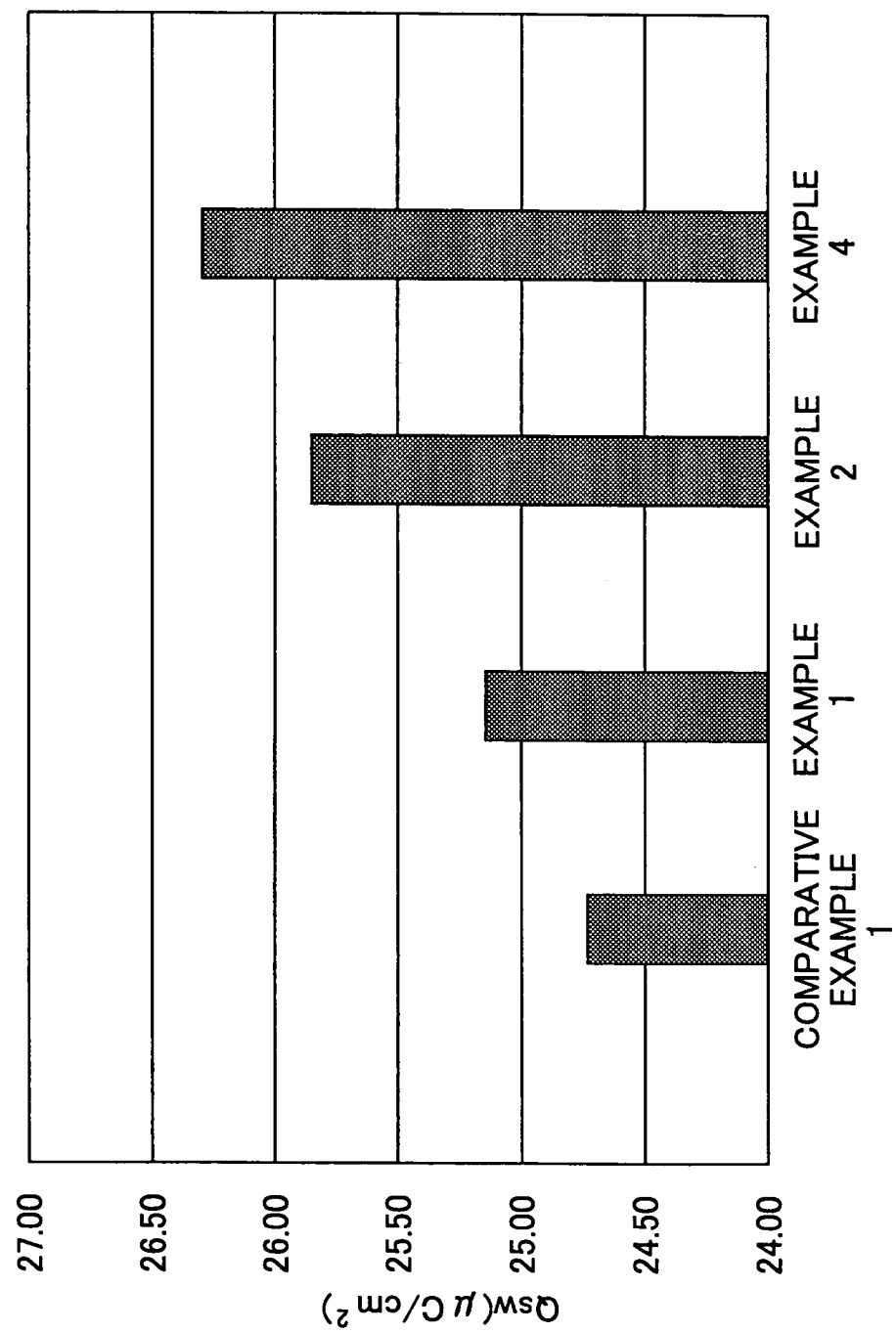
FIG. 15 is another diagram showing the switching electric charge $Q_{SW}$ for the present invention and a comparative example.

FIG. 15 shows another example of $Q_{SW}$ measurement conducted for EXAMPLES 1, 2 and 4 and Comparative Example 1, wherein the semiconductor devices of these examples have the same construction as the semiconductor devices of corresponding examples of FIG. 14 but are prepared separately.

Referring to FIG. 15, it can be seen that in any of Examples 1, 2 and 4, there is an increase of the $Q_{SW}$ value as compared with Comparative Example 1.

More specifically, it can be seen that the $Q_{SW}$ value for Example 1 has increased over the case of Comparative Example 1, demonstrating excellent water blocking performance of the silicon oxynitride film. Particularly, it is noted that the Example 4 provides the highest $Q_{SW}$ value, indicating that influence on the ferroelectric capacitor 58 at the time of formation of the aluminum film is reduced.

Third Embodiment

Figure 16:
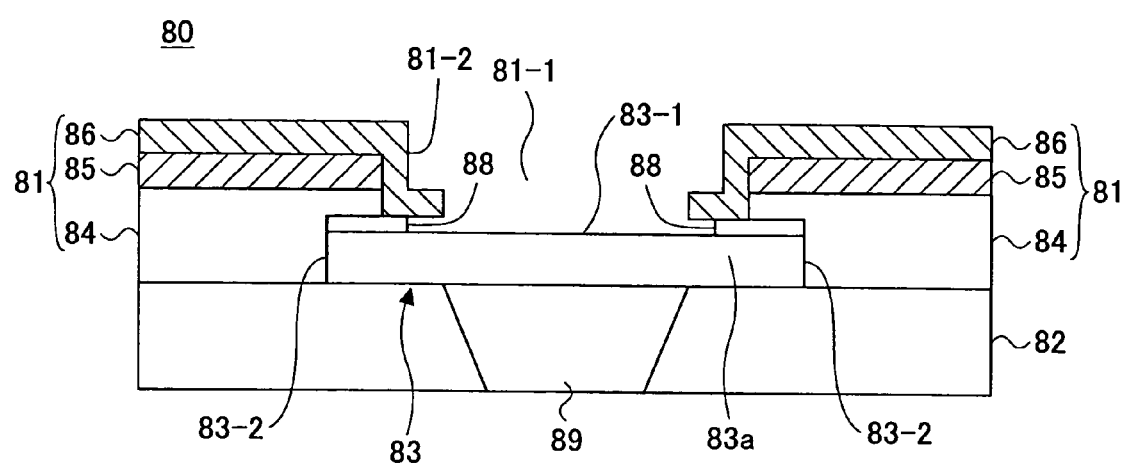
FIG. 16 is a cross-sectional diagram showing a part of a semiconductor device according to a third embodiment of the present invention.

FIG. 16 shows a part of a semiconductor device 80 according to a third embodiment of the present invention.

Referring to FIG. 16, the semiconductor device 80 of the present embodiment has a passivation film 81 formed of a silicon oxide film 84 formed on an interlayer insulation film 82 and first and second silicon nitride films 85 and 86 formed on the silicon oxide film 84.

The passivation film 81 is formed with an opening 81-1 exposing a surface 83-1 of an electrode pad 83 at a bottom part thereof, and a sidewall surface 81-2 defining the opening 81-1 is covered with a second silicon nitride film 86 that also covers the sidewall surface of the silicon oxide film 84. Further, a TiN film 88 is formed between the surface 83-1 of the electrode pad 83 and the silicon nitride film 86.

Figure 17:
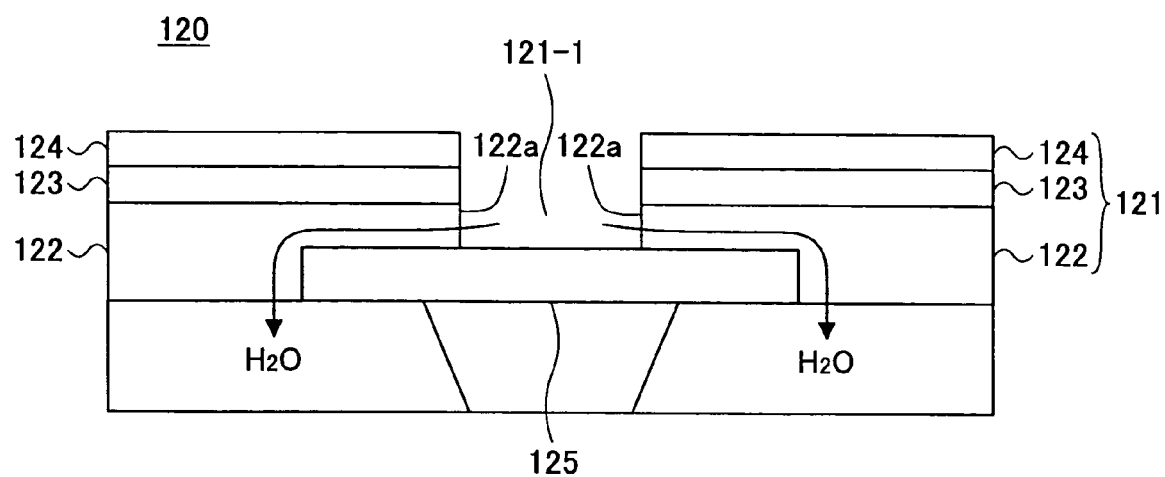
FIG. 17 is a cross-sectional diagram showing an example of a conventional passivation film.

In a conventional semiconductor device 120 shown in FIG. 17 having a passivation film 121 in which a silicon oxide film 122 is covered with a non-permeable silicon nitride film 123 or polyimide film 124, it should be noted that the silicon oxide film 122 is exposed at a sidewall surface 122a of an opening 121-1 exposing the surface of the electrode pad 125, and thus, external moisture penetrates into the interior of the semiconductor device 120 through the silicon oxide film 122 via the sidewall surface 122a and this has been the cause of deterioration of the ferroelectric capacitor.

In the case of the semiconductor device 80 of the present embodiment shown in FIG. 16, on the other hand, the silicon oxide film 84 is covered by the firs and second silicon nitride films 85 and 86 at the opening 81-1 formed in the passivation film 81, and thus, penetration of moisture into the interior of the semiconductor device from the opening 81-1 is effectively blocked. With this, defect formation is prevented effectively.

Here, it should be noted that the first and second silicon nitride films 85 and 86 function as the barrier layer blocking the water moisture. Of course, it is possible to use a polyimide film or non-permeable silicon oxynitride film explained with reference to the second embodiment for the barrier layer in place of the silicon nitride films 85 and 86. Further, these materials may be used in combination.

While not shown in FIG. 16 explicitly, it should be noted that the semiconductor device 80 of the present embodiment forms a ferroelectric random access memory of 1T1C type on the substrate similarly to the second embodiment shown in FIG. 7. Thereby, it is possible to omit the barrier layer 60 and the insulating metal oxide film 64 of FIG. 7. Of course, the semiconductor device 80 of the present embodiment can prevent deterioration of the ferroelectric capacitor more effectively by providing the barrier layer 60 and/or the insulating metal oxide film 64. Particularly, it is preferable to use an alumina film for the barrier layer 60 when a hydrogen gas is used or hydrogen gas is formed as a result of reaction at the time of formation of the first and second silicon nitride films 85 and 86. By doing so, it is possible to block the hydrogen gas or protons by the alumina barrier film 60 effectively, and hence it becomes possible to prevent formation of oxygen defects in the ferroelectric film constituting the ferroelectric capacitor.

FIGS. 18A–18C and 19A–19B are cross-sectional diagrams showing the fabrication process of the semiconductor device of the present embodiment.

Figure 18A:
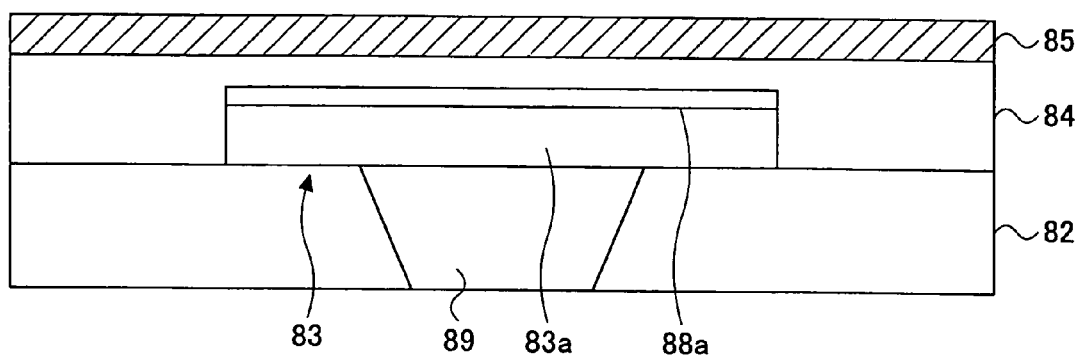
FIGS. 18A–18C are cross-sectional diagrams showing the fabrication process of a semiconductor device according to a third embodiment of the present invention.

In the step of FIG. 18A, an aluminum film 83a is formed on the interlayer insulation film 82 including a plug 89 exposed on the surface thereof by a sputtering process or CVD process with the thickness of 80 nm, and a TiN film 88a is formed on the aluminum film 83a by a sputtering process with the thickness of 50 nm. Further, by patterning the aluminum film 83a together with the TiN film 88a thereon, the electrode pad 83 is formed on the interlayer insulation film 83 in contact with the plug 89 embedded in the interlayer insulation film 83.

Here, it should be noted that the TiN film 88a functions as a protective film of the aluminum film 83a and prevents the surface of the aluminum film 83a from being oxidized at the time of the etching process conducted in a later process. Further, it should be noted that there is already formed a ferroelectric random access memory device such as the one explained with reference to the second embodiment underneath the interlayer insulation film 82 at the time of the step of FIG. 18A. Of course, such an ferroelectric random access memory device is not limited to the one explained with reference to the second embodiment and may be formed by other known construction and process.

In the step of FIG. 18A, there is further formed the silicon oxide film 84 by a sputtering process or CVD process such that the silicon oxide film 84 covers the electrode pad 83 and the surface of the interlayer insulation film 82, wherein the silicon oxide film 84 thus formed is subjected to a planarization process by a CMP process. Typically, the silicon oxide film 84 is formed to have the thickness of 1050 nm such that there is secured a distance of 200 nm from the surface of the TiN film 88a to the surface of the silicon oxide film 84.

Next, in the step of FIG. 18A, the first silicon nitride film 85 is formed on the silicon oxide film 84 by a CVD process, wherein the first silicon nitride films 85 is formed by using any of a silane gas, a $SiH_2Cl_2$ gas or a $SiCl_4$ gas and further an $NH_3$ gas to have the film thickness of 200 nm.

More specifically, the first silicon nitride film 85 is formed by a plasma CVD process at the substrate temperature of 400° C. while supplying the silane gas and the NH3 gas with respective flow rates of 500 sccm and 3800 sccm under the process pressure of 200 Pa while supplying an RF power of 500 W at the frequency of 13.56 MHz and an LF power of 250 W at the frequency of 250 kHz.

Figure 18B:
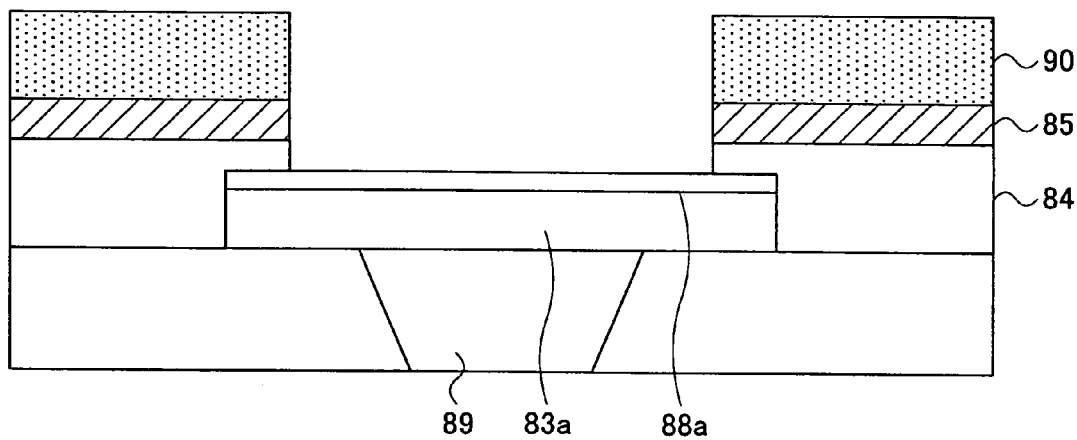

Next, in the step of FIG. 18B, a resist film 90 is formed on the first silicon nitride film 84, followed by a patterning process to form a resist opening 90-1 in alignment with the electrode pad 83 with a size larger than the size of an ordinary opening for the electrode pad by 4 µm. Further, the first silicon nitride film 85 is subjected to an etching process while using a mixed gas of CF4 and oxygen while using the resist film 90 thus patterned as a mask, followed by the etching process of the silicon oxide film 84 while using a C2F6 etching gas, such that the TiN film 88a is exposed.

Figure 18C:
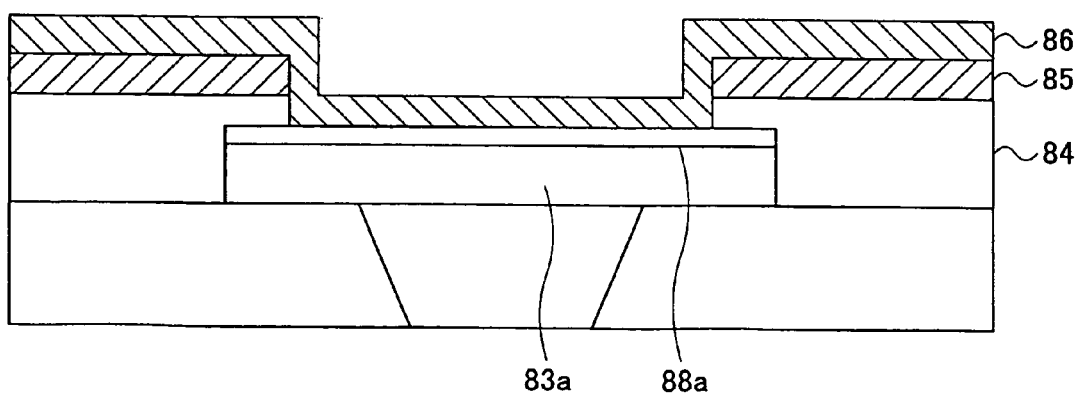

Next, in the step of FIG. 18C, the resist film 90 of FIG. 18B is removed and the second silicon nitride film 86 is formed so as to cover the TiN film 88a and the silicon nitride film 85. Thereby, it should be noted that the second silicon nitride film 86 is formed similarly to the first silicon nitride film 85 with the thickness of 200 nm.

Figure 19A:
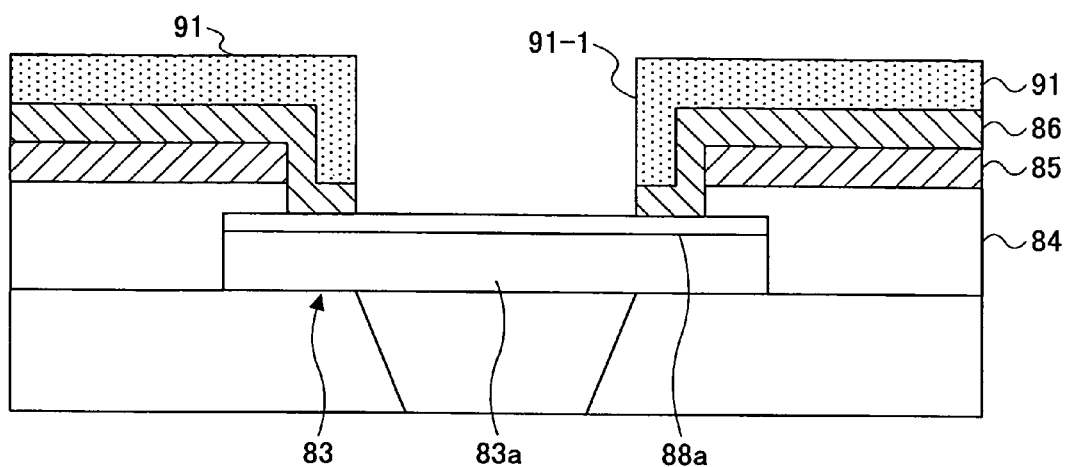
FIGS. 19A and 19B are cross-sectional diagrams showing the fabrication process of the semiconductor device according to the third embodiment of the present invention.

Next, in the step of FIG. 19A, a resist film 91 is formed on the surface of the structure of FIG. 18C, wherein the resist film 91 is patterned in the step of FIG. 19A such that there is formed a resist opening 91-1 with a size of ordinary electrode pad opening. With this, it should be noted that the resist film 91 forms an opening at the opening 91-1 in such a manner that the resist film 91 covers the sidewall surface of the second silicon nitride film 86 at the foregoing opening 91-1. Further, the second silicon nitride film 86 is subjected to a dry etching process with a recipe realizing a large etching selectivity between the silicon nitride film 86 and the TiN film 88a by using $C_2Cl_2F_4$ as the etching gas while using the resist film 91 as a mask, until the TiN film 88a is exposed at the opening 91-1.

Figure 19B:
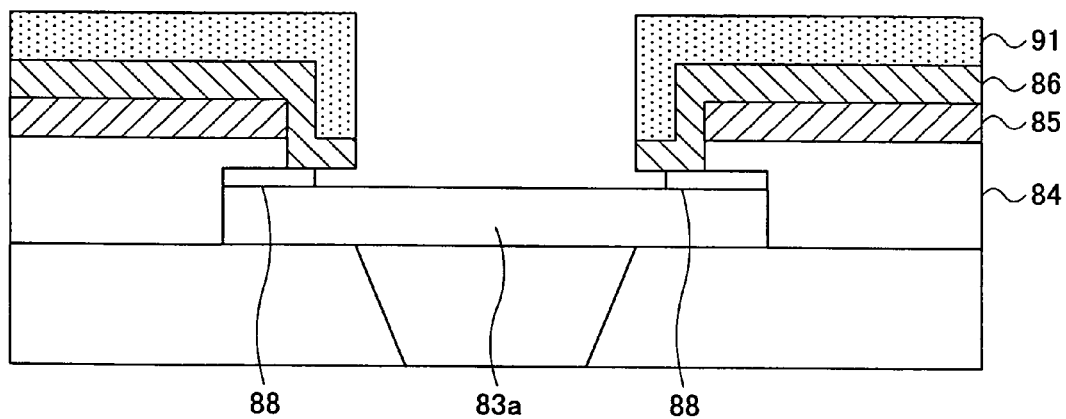

Next, in the step of FIG. 19B, the TiN film 88a is etched by using an isotropic etching process while using the resist film 91 as a mask, such that the aluminum film 83a of the electrode pad 83 is exposed. Associated with such an isotropic etching process, there occurs a slight recession in the sidewall surface of the TiN film 88 sandwiched between the second silicon nitride film 86 and the aluminum film 83a.

Further, by removing the resist film 91 in this state, the passivation film 81 shown in FIG. 16 is obtained.

According to the present embodiment, the sidewall surface 81-2 of the opening 81-1 formed in the passivation film 81 for the electrode pad 83 is covered by the silicon nitride film 86 having the nature of non-permeability. There occurs no exposure of the silicon oxide film. Thereby, the path of moisture penetration from outside is blocked and the degradation of the ferroelectric capacitor caused by such moisture penetration is effectively suppressed.

Further, the present invention is not limited to the embodiments described heretofore, but various variations and modifications may be made without departing from the scope of the invention. Further, it is possible to combine the first embodiment with the second embodiment including its modification in the semiconductor device of the present invention. Further, the third embodiment may be combined additionally. Further, it is possible to combine the first embodiment and the third embodiment or the second embodiment including the modification thereof with the third embodiment. Thereby, the effect of preventing the moisture from reaching the circuit part is enhanced.

What is claimed is:

1. A semiconductor device comprising:
   a semiconductor substrate;
   a circuit part formed on and above said semiconductor substrate;
   a passivation film covering said circuit part;
   an electrode pad provided outside said circuit part in such a manner that said electrode pad is exposed from said passivation film; and
   a guard ring pattern provided between said electrode pad and said circuit part such that said guard ring pattern surrounds said circuit part substantially, said guard ring pattern extending from a surface of said semiconductor substrate to said passivation film.

2. The semiconductor device as claimed in claim 1, wherein said guard ring pattern comprises a metal or an alloy.

3. The semiconductor device as claimed in claim 1, wherein said guard ring pattern extends continuously except for a part where there is provided an interconnection pattern connecting said electrode pad with said circuit part.

4. The semiconductor device as claimed in claim 1, further comprising another guard ring pattern disposed outside said electrode pad such that said another guard ring pattern surrounds said electrode pad and said guard ring pattern.

5. The semiconductor device as claimed in claim 1, wherein said circuit part comprises a ferroelectric capacitor.

6. A semiconductor device comprising:
   a semiconductor substrate;
   a ferroelectric capacitor formed over said semiconductor substrate, said ferroelectric capacitor including a ferroelectric capacitor insulation film;
   an interlayer insulation film covering said ferroelectric capacitor;
   a barrier layer covering said interlayer insulation film, said barrier layer being made of an electrically insulating material blocking penetration of moisture therethrough;
   a silicon oxide film covering said barrier layer;

an interconnection layer formed on said silicon oxide film, said interconnection layer being connected to electrodes of said ferroelectric capacitor; and an insulating metal oxide film covering said barrier layer and said interconnection layer.

7. The semiconductor device as claimed in claim 6, wherein said barrier layer comprises a silicon oxynitride film.

8. The semiconductor device as claimed in claim 7, wherein said barrier layer comprises a silicon oxynitride film converted from a silicon oxide film by an oxynitriding processing.

9. The semiconductor device as claimed in claim 8, wherein said silicon oxynitride film is formed by converting a surface of said silicon oxide film.

10. A semiconductor device comprising:

a semiconductor substrate;

a circuit part formed on and above said semiconductor substrate, said circuit part including a ferroelectric capacitor;

an interlayer insulation film covering said circuit part; an electrode pad formed over said interlayer insulation film; and a passivation film covering the entirety of said interlayer insulation film except for an opening formed in said passivation film so as to expose a surface of said electrode pad, said passivation film comprising a barrier layer blocking penetration of moisture, said barrier layer covering the entirety of an inner wall surface of said opening.

11. The semiconductor device as claimed in claim 10, wherein said passivation film comprises a silicon oxide film and a barrier layer formed on said silicon oxide film, said barrier layer covers a surface and a sidewall surface of said silicon oxide film.

12. The semiconductor device as claimed in claim 11, wherein said barrier layer comprises a first silicon nitride film covering a surface of said silicon oxide film and a second silicon nitride film covering a sidewall surface of said silicon oxide film.

13. The semiconductor device as claimed in claim 10, further comprising a TiN film inserted between said barrier layer and said electrode pad.

* * * * *